(12) United States Patent
Ashpis

(10) Patent No.: US 7,999,173 B1
(45) Date of Patent: Aug. 16, 2011

(54) DUST REMOVAL FROM SOLAR CELLS

(75) Inventor: David E. Ashpis, Beachwood, OH (US)

(73) Assignee: The United States of America as represented by the Administrator of National Aeronautics and Space Administration, Washington, DC (US)

( * ) Notice: Subject to any disclaimer, the term of this patent is extended or adjusted under 35 U.S.C. 154(b) by 756 days.

(21) Appl. No.: 11/689,431

(22) Filed: Mar. 21, 2007

(51) Int. Cl.
*H01L 31/00* (2006.01)

(52) U.S. Cl. ........ 136/251; 136/244; 136/291; 136/256; 136/259

(58) Field of Classification Search ............... 136/243, 136/244, 252, 291–293; 15/1.51; 134/1
See application file for complete search history.

(56) References Cited

U.S. PATENT DOCUMENTS

| | | | |
|---|---|---|---|
| 3,095,163 A | 6/1963 | Hill | |
| 4,491,683 A | 1/1985 | Baranov | |
| 4,834,805 A * | 5/1989 | Erbert | 136/246 |
| 5,387,842 A | 2/1995 | Roth | |
| 5,414,324 A | 5/1995 | Roth | |
| 5,669,583 A | 9/1997 | Roth | |
| 5,800,631 A | 9/1998 | Yamada | |
| 5,894,853 A | 4/1999 | Fujisaki | |
| 5,938,854 A | 8/1999 | Roth | |
| 6,146,724 A | 11/2000 | Roth | |
| 6,200,539 B1 | 3/2001 | Sherman | |
| 6,239,352 B1 | 5/2001 | Luch | |
| 6,281,492 B1 | 8/2001 | Almesiker | |
| 6,335,479 B1 | 1/2002 | Yamada | |
| 6,406,759 B1 | 6/2002 | Roth | |
| 6,501,014 B1 | 12/2002 | Kubota | |
| 6,676,802 B2 | 1/2004 | Roth | |
| 6,911,593 B2 | 6/2005 | Mazumder | |
| 2002/0000779 A1 | 1/2002 | Anders | |
| 2003/0029566 A1 | 2/2003 | Roth | |
| 2003/0141820 A1 | 7/2003 | White | |
| 2004/0055632 A1* | 3/2004 | Mazumder et al. | 136/244 |
| 2004/0194223 A1 | 10/2004 | Cernak | |
| 2005/0001527 A1 | 1/2005 | Sugiyama | |
| 2005/0139229 A1 | 6/2005 | Kurunczi | |
| 2005/0179395 A1 | 8/2005 | Pai | |

(Continued)

OTHER PUBLICATIONS

Sims et al., "Development of a Transparent Self-Cleaning Dust Shield for Solar Panels", Proceedings of the First Joint Meeting IEEE-IAS and Electrostatics Society of America (ESA), Laplacian Press, Morgan Hill, CA, pp. 814-821, Little Rock, Arkansas, Jun. 2000.*

(Continued)

*Primary Examiner* — Jennifer K. Michener
*Assistant Examiner* — Jayne Mershon
(74) *Attorney, Agent, or Firm* — Robert H. Earp, III

(57) ABSTRACT

A solar panel cleaning device includes a solar panel having a plurality of photovoltaic cells arranged in rows and embedded in the solar panel with space between the rows. A transparent dielectric overlay is affixed to the solar panel. A plurality of electrode pairs each of which includes an upper and a lower electrode are arranged on opposite sides of the transparent dielectric and are affixed thereto. The electrodes may be transparent electrodes which may be arranged without concern for blocking sunlight to the solar panel. The solar panel may be a dielectric and its dielectric properties may be continuously and spatially variable. Alternatively the dielectric used may have dielectric segments which produce different electrical field and which affects the wind "generated."

15 Claims, 17 Drawing Sheets

U.S. PATENT DOCUMENTS

2005/0241582 A1 11/2005 Dobbyn
2006/0022606 A1 2/2006 DeVries

OTHER PUBLICATIONS

Landis et al., "Dust Mitigation for Mars Solar Arrays", IEEE Proceedings, pp. 812-815, 2002.*
Merriam-Webster on-line dictionary, definition: plasma, downloaded Aug. 9, 2010.*
Lie et al., "Particle Transport by Standing Waves on an Electric Curtain", Journal of Eelctrostatics, Vo. 68, pp. 289-298, 2010.*
Atten et al., "Study of Dust Removal by Standing Wave Eletric Curtain for Application to Solar Cells on Mars", IEEE Proceedings, pp. 334-340, 2005.*
Biris et al., Electrodynamic Removal of Contaminat Particles and Its Applications, IEEE Proceedings, 2004.*
Schmidlin, "Modes of Traveling Wave Particle Transport and Their Appications", Journal of Electrostatics, vol. 34, pp. 225-244, 1993.*
Optimization of The Aerodynamic Plasma Actuator as an Electrohydrodynamic (EHD) Electrical Device. J. Reece Roth and Xin Dai, 44TH Aerospace Sciences, Meeting and Exhibit, Jan. 2006, Reno, Nevada.
Optimization of a Dielectric Barrier Discharge Actuator by Stationary and Non-Stationary Measurements of The Induced Flow Velocit-Application to Airflow Control, M. Forte, J. Jolibois, E. Moreau, G. Touchard, Laboratorie D'Etudes Aerodynamiques (UMR CNRS 6609), BP 30179, 86962 Futurscop Cedex France and M. Cazalens, SNECMA (SAFRAN Group), 77550 Moissy Cramayel, France, 3RD AIAA Flow Control Conference, Jun. 5-8, 2006, San Franciso, California, AIAA 2006-2863, 2006.
Flow Control With Single Dielectric Barrer Plasma Actuators, Martiqua L. Post and Thomas C. Corke,University of Notre Dame, Center for Flow Physics and Control, Aerospace and Mechanical Engineering Department, Norte Dame, IN 46556, 35th AIAA Fluid Dynamics Conference and Exhibit, Jun. 6-9, 2005, Toronto, Ontario Canada.
An Experimental Study of The Dry Deposition Mechanism for Airborne Dust, Sergey Biryukov, J. Aerosol Sci., vol. 29, No. 1/2, pp. 129-139, 1998, Copyright 1998 Elsevier Science, Ltd.
Plasma Display Panels; physics, recent developments and key issues; JP Boeuf, J. Phys. D: Appl. Phys. 36 (2003) R53-R79.
Dust Mitigation for Mars Solar Arrays, Geoffrey A. Landis, NASA Glenn Research Center, 21000 Brookpark Road, Cleveland, Ohio 44135, 2002, Philip P. Jenkins, Ohio Aerospace Institute, M/S 302-1, 21000 Brookpark Road, Cleveland, Ohio 44135.
An Optical System for the Quantitative Study of Particulate Contamination on Solar Collector Surfaces, S. Biryukov, D. Faiman, and A. Goldfeld, Solar Energy vol. 66, No. 5, pp. 371-378, 1999, Copyright 199 Elsevier Science, Ltd.
Mars Dust Removal Technology, Geoffrey A. Landis, Ohio Aerospace Institute, Nasa Glenn Research Center, 1997, Cleveland, Ohio 44135, AIAA Journal of Propulsion and Power vol, 14, No. 1, 126-128, Jan. 1998, Paper Jecec 97-97340, Intersociety Energy Conversion Engineering Conference, Jul. 27-Aug. 1, 1997.
Plasma Actuators for Separation Control of Low-Pressure Turbine Blades, Junhui Huang, Thomas C. Corke, and Flint O. Thomas, University of Notre Dame, MOTR Dame, Indiana 46556, AIAA Journal, vol. 44, No. 1, Jan. 2006.
Tip Clearance Control Using Plasma Actuators, Scott C. Morriss, Thomas C. Corke, Daniel Van Ness, Julia Stephens and Travis Douville, Department of Aerospace, 2005, and Mechanical Engineering, University of Notre Dame, Notre Dame, IN. 46556, 43RD AIAA Aerospace Sciences 2005, Meeting and Exhibit, Jan. 10-13, 2005, Reno, Nevada, AIAA 2005-782.
Overview of Plasma Flow Control: Concepts, Optimization, and Applications, Thomas C, Corke and Martiqua L. Post, University of Notre Dame, Center for Flow Physics and Control, Aerospace and Mechanical Engineering Department, Notre Dame, IN 46556, 43RD AIAA Aerospace Sciences Meeting and Exhibit, Jan. 10-13, 2005, Reno, Nevada.
The Effect of Martian Dust on Radiator Performance, D. Keith Hollingsworth, Larry C. Witte, Ashley Higgins, 68 ISSO-UH/UHCL/NASA, 2006.
Development of a Transparent Self-Cleaning Dust Shield for Solar Panels, R. A. Sims, A.S. Biris, J. D. Wilson, C. U. Yurteri, M/K. Mazumder, C. I. Calle and C. R. Buhler, Department of Applied Science, University of Arkansas AT Little Rock, 2801 South University Ave., Little Rock AR 72204, 2000.
Demonstration of Separation Delay With Glow-Discharge Plasma Actuators, Lennart S. Hultgren and David E. Ashpis, Glenn Research Center, Cleveland Ohio, NAS/TM—2003-212204/REV 1, AIAA-2003-1025, 2003.
Numerical Simulations of Plasma Based Flow Control Applications, Y. B. Suzen, P. G. Huang, J.D. Jacob, Department of Mechanical Engineering, University of Kentucky, Lexington, KY, 40506 and D. E Ashpis, Nasa John H. Glenn Research Center at Lewis, Cleveland, Ohio 44135. 35th Fluid Dynamics Confernce and Exhibit, Jun. 6-9, 2005, Toronto, Ontario.
Preliminary Experiments of Barrier Discharge Plasma Actuators Using Dry and Humid Air, Richard Anderson and Subrata Roy, 44TH AIAA Aerospace Sciences Meeting and Exhibit, Jan. 2006, Reno, Nevada.
Electrohydrodynamic Force and Acceleration in Surfaces Discharges, J. P. Boeuf, Y. Lagmich, TH. Callegari and L. C. Pitchford, American Institute of Aeronautics and Astronautics.
Electrohydrodynamic Force and Aerodynamic Flow Acceleration in Surface Dielectric Barrier Discharge, J. P. Boeuf and L.C. Pitchford, Journal of Applied Physics 97, 103307 (2005).
"Electrohydrodynamic Flow Control With a Glow-Discharge Surface Plasma" by J.R. Roth, D.M. Sherman and S.P. Wilkinson, Aiaa Journal vol. 38, No. 7, Jul. 2000.
"Aerodynamic Flow Acceleration Using Paraelectric and Peristaltic Electrohydrodynamic Effects of a One Atmosphere Uniform Glow Discharge Plasma" by R. Roth, Physics of Plasmas vol. 10, No. 5, pp. 2117-2126 May 2003.
"Modeling of Interaction Between Weakly Ionized Near-Surface Plasmas and Gas Flow" by A.V. Likhanskii, M.N, Shneider, S.O. Macheret and R.B. Miles, AIAA Paper 2006-1204.
"Unsteady Plasma Actuators for Separation Control of Low-Pressure Turbine Blades" by Junhui Huang, Thomas C. Corke, and Flint O. Thomas, University of Notre Dame, Indiana, AIAA Journal, vol. 44, No. 7, Jul. 2006. pp. 1477-1487.

* cited by examiner

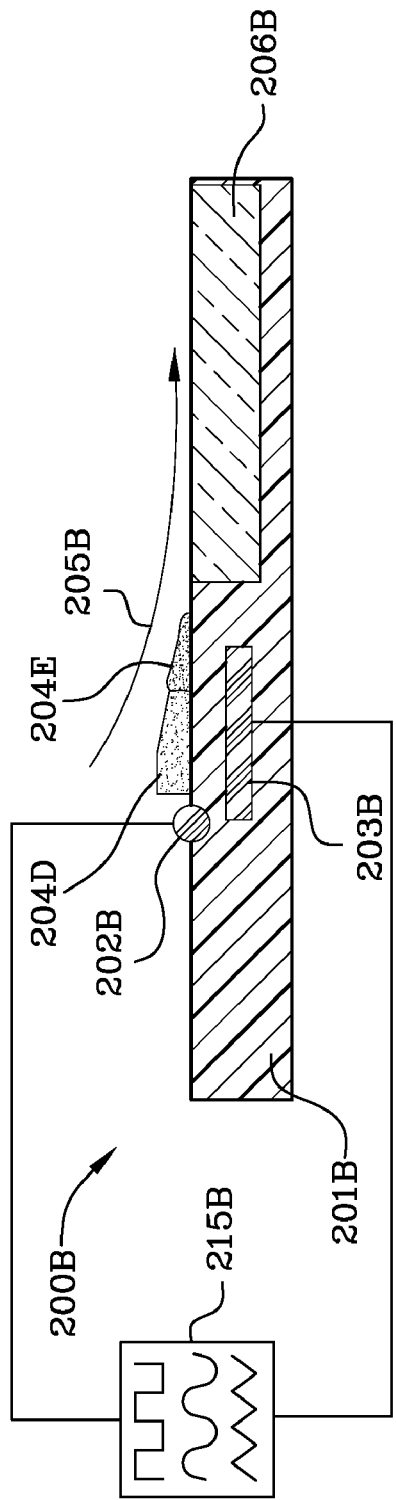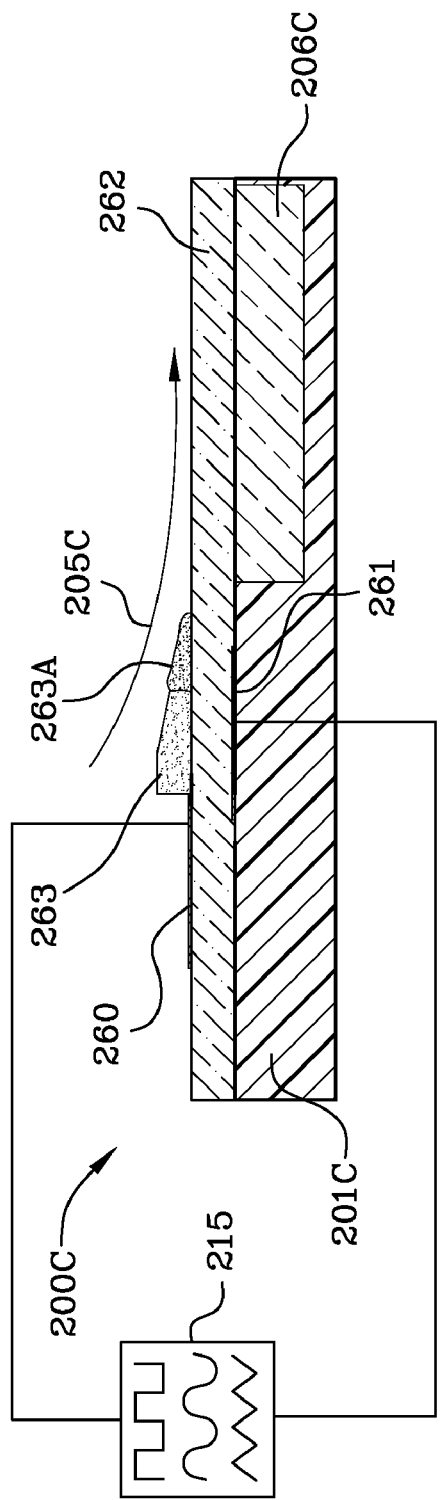

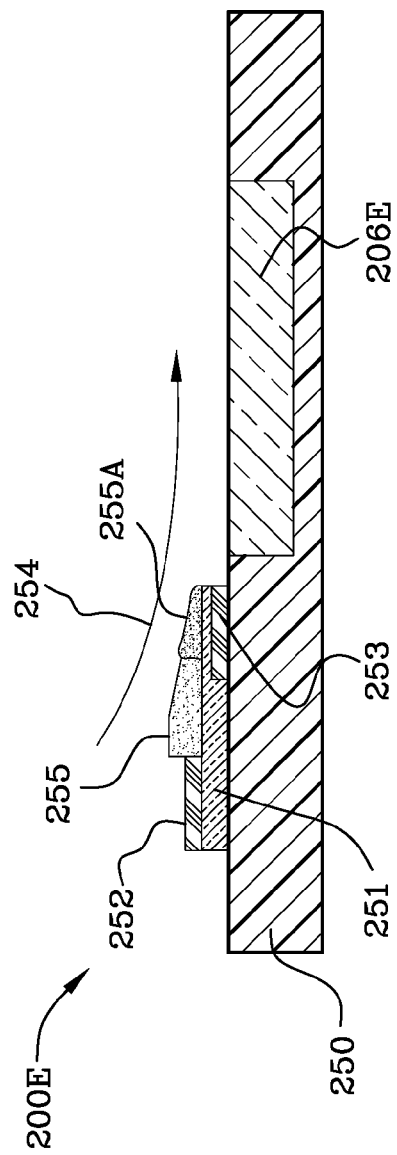
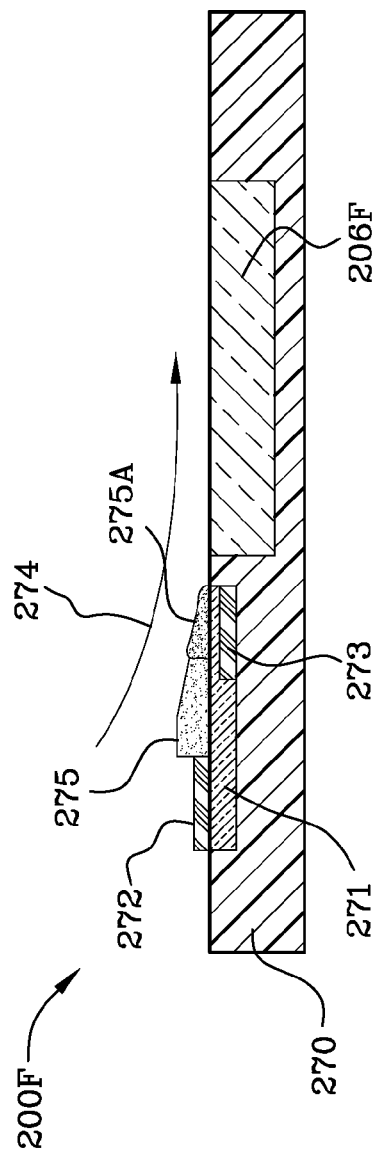

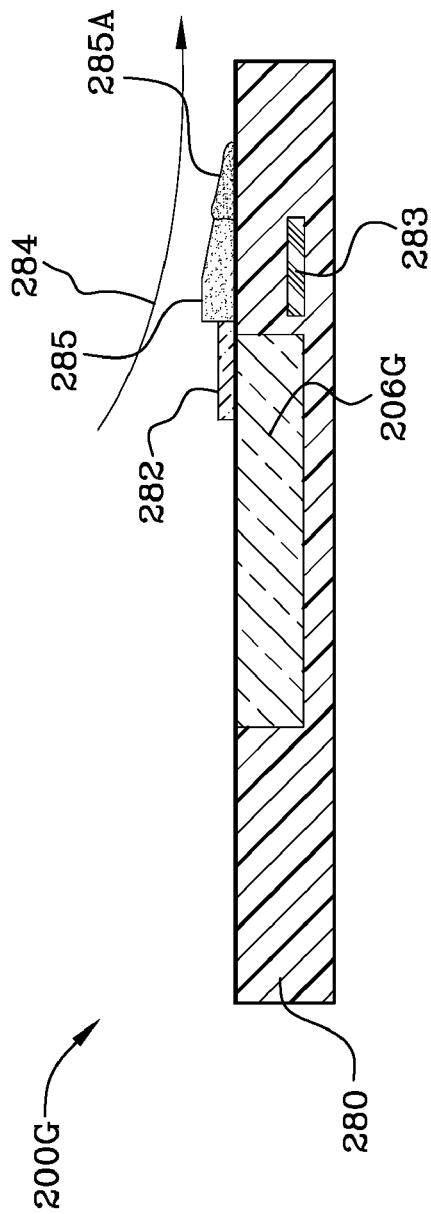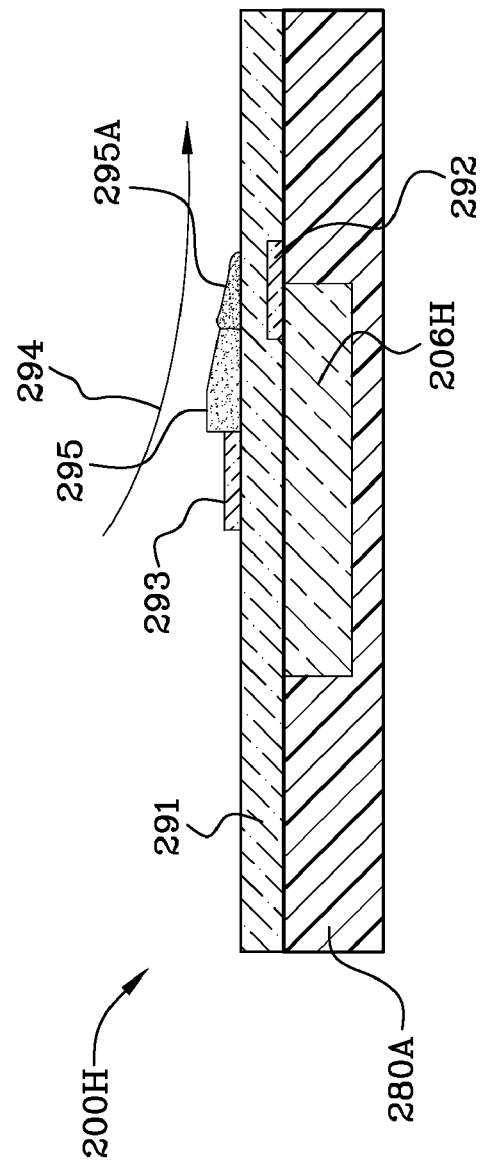

FIG. 2"O"

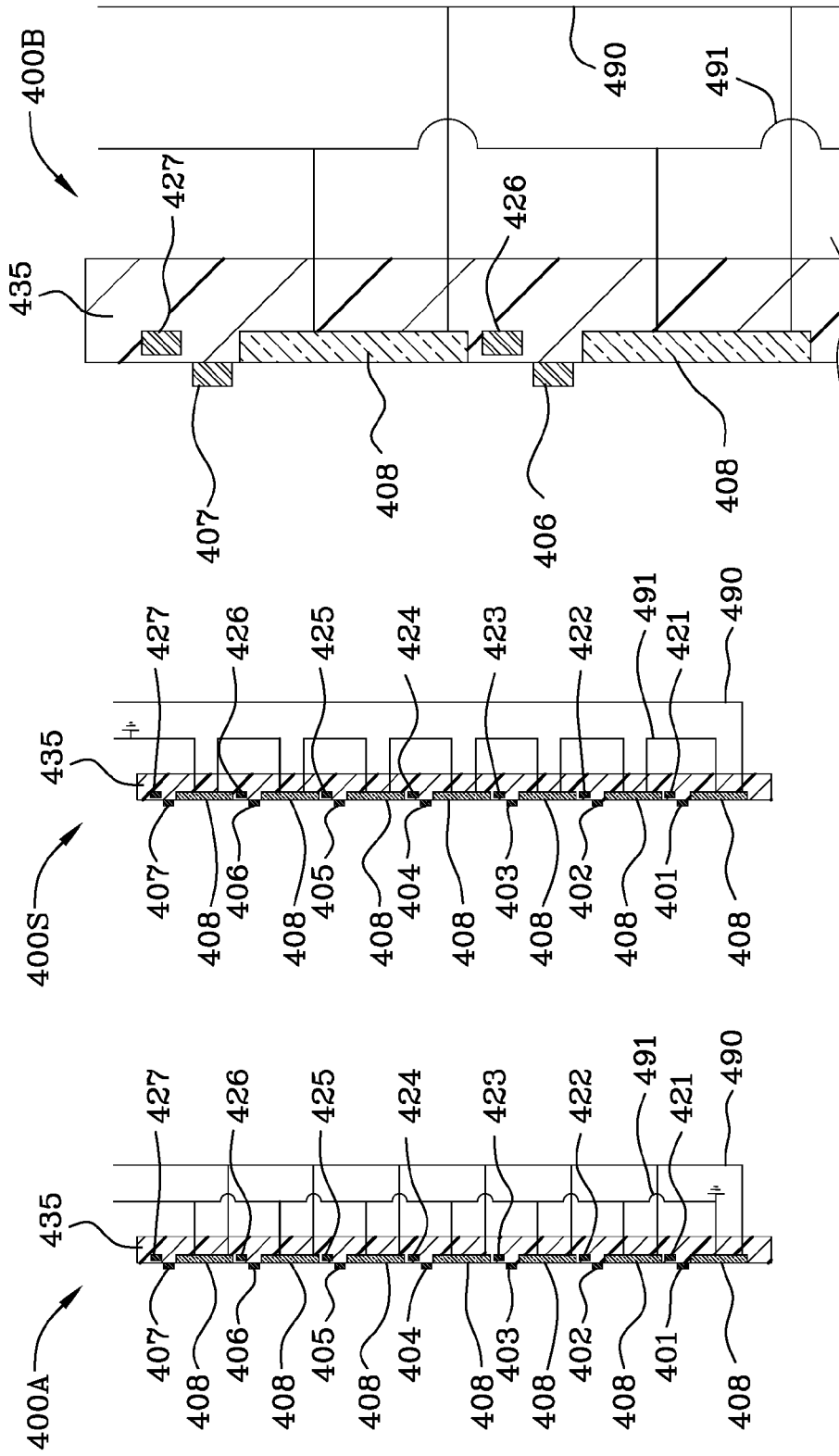

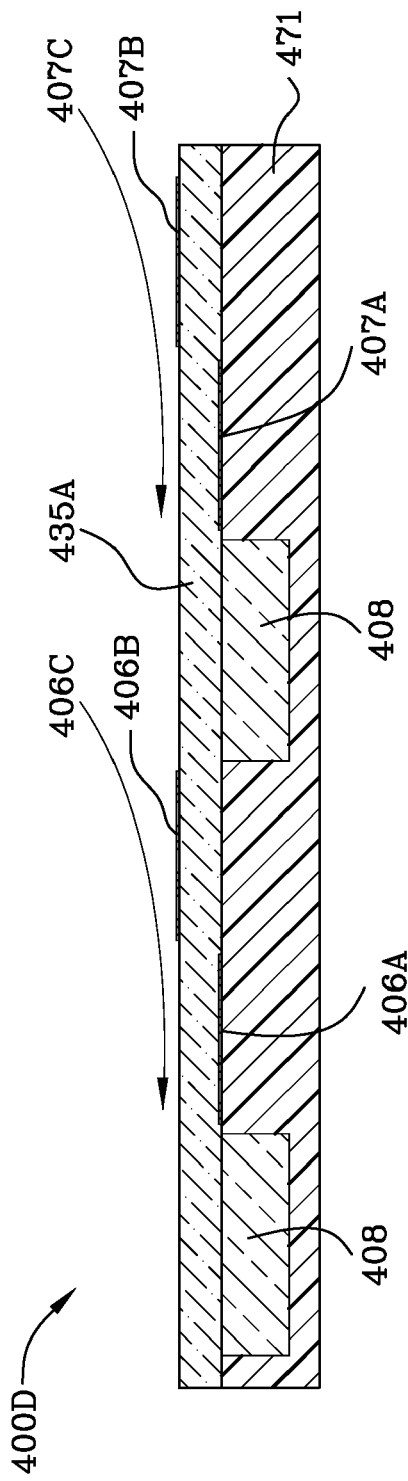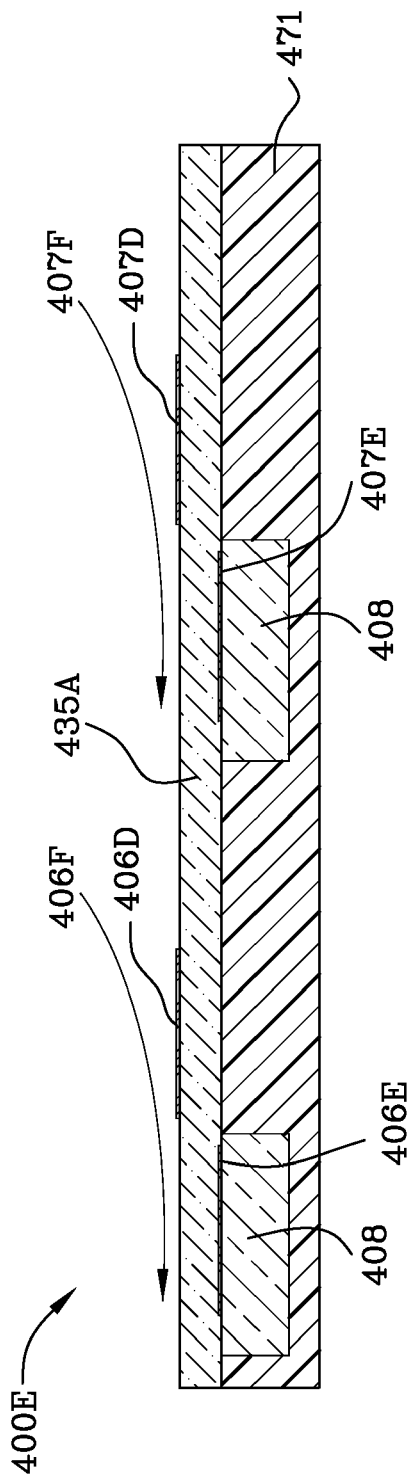

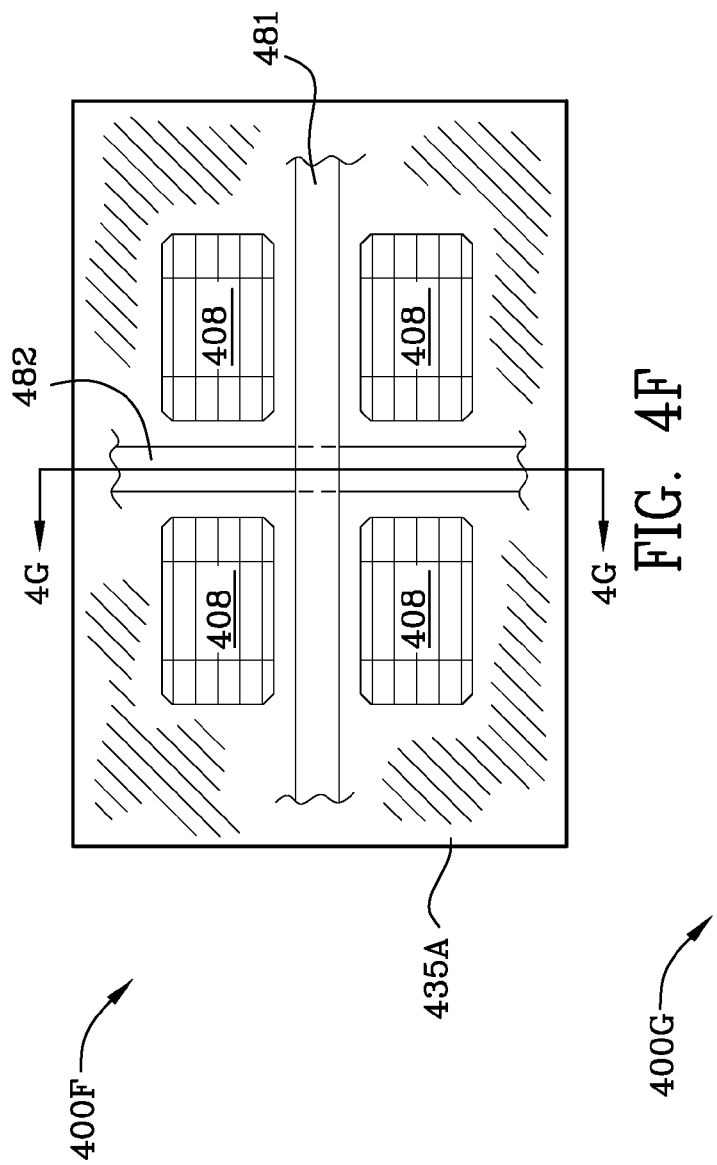
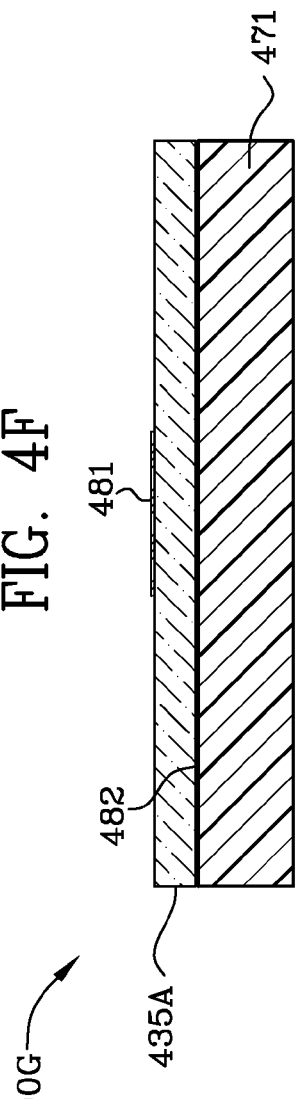

DUST REMOVAL FROM SOLAR CELLS

ORIGIN OF THE INVENTION

The invention described herein was made by an employee of the United States Government, and may be manufactured and used by the government for government purposes without the payment of any royalties therein and therefor.

FIELD OF THE INVENTION

The invention is directed toward dust removal from solar cells and in particular it is directed toward efficient low-power dust removal from solar cells which will operate on the planet Mars or on any planet or celestial body with an atmosphere.

BACKGROUND OF THE INVENTION

A solar cell (or photovoltaic cell) is a semiconductor device that converts photons into electricity. Solar cells generate charge carriers (electrons and holes) in a light absorbing material. Solar cells separate the charge carriers to conductive contacts that transmit electricity. This conversion is called the photovoltaic effect, and the field of research related to solar cells is known as photovoltaics. A solar panel is a collection or arrangement of solar cells. The arrangement of solar cells may be in an array.

Solar cells may be grouped together to form arrays and an array or arrays may be arranged as desired on a solar panel. The panels, in turn, may be arranged in an array. Dust settling on the solar cells obscures the light and therefore reduces the amount of electricity that the solar cells produce. The problem exists in terrestrial applications of solar cells as well as in applications on other planets (extra terrestrial applications).

The article entitled "An Optical System for the Quantitative Study of Particulate Contamination on Solar Collector Surfaces" by S. Biryukov, D. Faiman and A. Goldfeld, Solar Energy, Vol. 66, No. 5 pp. 371-378, 1999, and the article "An Experimental Study of the Dry Deposition Mechanism for Airborne Dust" by S. Biryukov, Journal of Aerosol Sciences, Vol. 29 No. 1/2 pp. 129-139, 1998, indicates that there is 10% degradation of solar cell performance on earth caused by dust. The article describes a study of dust settlement in a desert area and a system to measure dust deposition with the goal of development of methods for retarding the settlement of dust and self cleaning of dust that has settled. The papers indicate that there is a need for self cleaning of dust from solar cells as it has advantages over cleaning the solar cells for example by washing them with water.

Solar cells have been used and are planned to be used in space missions to other planets. Solar cell arrays are powering two rovers sent to Mars. These rovers suffered from degradation of their power supply system because of dust that covered their solar arrays.

The Abstract of an Article Entitled

"Mars Dust Removal Technology" by Geoffrey A. Landis, Ohio Aerospace Institute, Cleveland, Ohio 44135, published as paper IECEC 97-97345 in the proceedings of the Energy Conversion Engineering conference, Jul. 27-Aug. 1, 1997 (also published in AIAA Journal of Propulsion and Power, Vol. 14, No. 1, pp. 126-128, January 1998) states: "The Mars atmosphere contains a significant load of suspended dust. Settling of atmospheric dust onto the surface of the solar array is potentially a lifetime-limiting factor for a power system on any Mars mission. For long-term operation of [solar] arrays on Mars, it may be necessary to develop techniques to remove deposited dust. Dust is expected to adhere to the array by Van der Waals adhesive forces. These forces are quite strong at the dust particle sizes expected. If the array surface is insulating, it is possible that they may also be subject to electrostatic adhesion, which may be extremely strong. Dust-removal methods must overcome this force. Dust-removal methods can be categorized briefly into four categories: natural, mechanical, electromechanical, and electrostatic. The environment of Mars is expected to be an ideal one for use of electrostatic dust-removal techniques."

Dr. Landis further states in the article that: "The atmosphere of Mars is known to contain a significant load of suspended dust. This atmospheric dust will have several effects on the use of photovoltaic power systems on the surface, including decreasing the amount of sunlight on the surface and shifting the spectrum of the available sunlight. There are several mechanisms for sand and dust to be deposited on a solar array. Particles may accumulate on the array by the process of saltation, the lifting of particles by wind. On Mars, the particle sizes most easily lifted by wind have a range of 50-100 µm in radius, and hence is best referred to [as] fine sand. The trajectories average a height of 10 to 20 cm off the surface. At the Mars atmospheric pressure of about 10 mbar, saltation occurs at wind velocities over about 15 m/s, a wind velocity only seen during brief gusts at the Viking lander sites. To avoid coverage of the array by saltation, it is desirable to design the arrays to be at least 20 cm from the surface.

It is expected that atmospheric dust will settle out of the atmosphere. The rate and mechanism of settling are not well characterized, but estimates indicate that obscuration of an array surface by dust may cause between 22% and 89% degradation in performance over the course of a two-year mission. This is shown in Table 1.

Some information on the settling of dust has been generated by the Materials Adherence Experiment on the Mars Pathfinder mission, which shows a deposition rate of about 0.3% coverage per day . . . but the deposition rate is expected to be both geographically variable and also to vary from season to season and from year to year.

| Case | obscuration (30 day mission) | obscuration (2 yr mission) |
| --- | --- | --- |
| Baseline | 6.6% | 77% |
| Best | 0.5% | 22% |
| Worst | 52.2% | 89% |

Table 1: Calculated power loss of solar array due to settled dust for 30-day and 2-year missions on Mars for baseline, best-case, and worst-case scenarios." (Citations Omitted)

The 1997 article by Dr. Landis just quoted in detail above further indicates that solar cells (photovoltaic cells) may "conceivably" be cleaned by glow discharge cleaning. But no details are given as to how this technique is to be used. It is understood that the glow discharge is used as a means to charge the dust with electrostatic charge in order to repel it. The dust removal is not accomplished by a plasma generated "wind."

A technique to remove dust by generating a moving electrostatic wave which discloses a transparent dust shield having parallel electrodes etched on a clad board driven by an alternating current source is described in the article "Development of a Transparent Self-Cleaning Dust Shield for Solar Panels" by Sims, R. A., Biris, A. S., Wilson, J. D., Yurteri, C. U., Mazumder, M. K., Calle, C. I., and Buhler, C. R., Proceedings of the ESA-IEEE Joint Meeting on Electrostatics 2003, Laplacian Press, Morgan Hill, Calif., pp. 814-821

(2003). Various line thicknesses and spacings were used. The electrodes, as understood, were covered by a highly resistive polyurethane coating to prevent discharge between the electrodes at high voltages. The lines were arranged in parallel such that every other line was connected to one terminal of an alternating current source. As understood this article is reporting and disclosing use and testing of electrodes on the same side of a substrate or screen. As understood, this arrangement works on an electrostatic wave principle and is not based upon a plasma generated "wind." The reference discloses operation at a frequency between 0-300 Hz while the voltage was varied from 0-10 kV. The reference appears to generally conclude that cleaning of the screen is increased at high frequency and high voltage. The article discloses that the use of the pulsed-wave was particularly effective in obtaining a high clearing factor. The next-most effective wave form was the square wave followed by the sinusoidal wave. Triangularly shaped waves were also applied but their efficacy in regard to clearing factor was not reported.

Another reference entitled "Electrohydrodynamic Force and Acceleration in Surfaces Discharges," J. Boeuf, Y. Lagmich, T. Calligari, and L. Pitchford, CPAT, CNR, Université P. Sabatier, Toulouse, France, AIAA-2006-3574, 37th AIAA Plasmadynamics and Lasers Conference, San Francisco, Calif., Jun. 5-8, 2006 discloses the basic electrode relationship for a dielectric barrier discharge device and concludes that the volume of the region where the ElectroHydroDynamic (EHD) force takes place is strongly dependent on the voltage risetime rate (or frequency, for a sinusoidal voltage). A clean signal is not required but fast risetime is advantageous for efficient functioning of a dielectric barrier discharge device. As understood, the force is distributed over a larger volume when the voltage increase rate is smaller. This article sets forth a numerical estimation for the force exerted on the gas molecules ahead of the ion sheath ahead of the plasma. In the reference, the force exerted on the discharge on the molecules is a function of the sheath length divided by the sheath velocity times the potential across the actuator squared divided by the sheath length cubed times the permittivity of free space.

FIG. 1 is a schematic of an existing dielectric barrier discharge device 100 having a bottom electrode 101, a top electrode 102 and a dielectric substrate 105 between the electrodes. Both electrodes 101 and 102 are affixed to the dielectric by adhesive 103, 104. Plasma 106 is illustrated forward of the top electrode with an ion sheath 106A leading the plasma. An alternating current source 107 is illustrated as being applied across the electrodes 101, 102.

Collisions between the ions and the neutrals creates the induced flow represented by the arrow and reference numeral 108. The induced flow occurs because the plasma generates a body force that creates velocity or a "wind" of gas. By "gas," it is meant the atmosphere in which the device resides.

Devices similar to the one described in FIG. 1 and variations of the device are used in aerodynamic applications. The idea is to affect external flow around airfoils and bodies and internal flow in inlets, ducts and turbomachinery passages for the purpose of achieving control of the flow and to reduce acoustic noise. The approach is called active flow control. The device can introduce momentum or disturbances into the flow that in turn have been shown in laboratory experiments to eliminate and reduce flow separation and control circulation around airfoils. Active flow control can be achieved by other types of devices, mainly pneumatic type devices that inject fluid into the flow or suck fluid out of the flow. However plasma devices discussed here have advantages over the pneumatic devices that make them attractive.

The article entitled "Electrohydrodynamic Flow Control with a Glow-discharge Surface Plasma" by J. R. Roth, D. M. Sherman and S. P. Wilkinson, AIAA Journal Vol. 38, No. 7, July 2000, describes experiments aimed mainly at drag reduction.

The article entitled "Overview of Plasma Flow Control: Concepts, Optimization and Application" by T. Corke and M. Post, AIAA Paper 2005-0563, 2005, reviews several applications in aerodynamics mainly aimed at separation elimination and circulation control.

U.S. Pat. No. 6,200,539 to Roth et al discloses a substrate configured with first and second sets of electrodes, where the second set of electrodes is positioned asymmetrically between the first set of electrodes. When an RF (radio frequency) voltage is applied to the electrodes sufficient to generate a discharge plasma (e.g. as named by Mr. Roth, "one-atmosphere uniform glow discharge plasma") in the gas adjacent to the substrate, the asymmetry in the electrode configuration results in force being applied to the active species in the plasma and in turn to the neutral background gas. It appears that the '539 patent to Roth operates at voltages greater than 1 kV.

U.S. Pat. No. 5,938,854 to Roth discloses a method and apparatus for cleaning surfaces with a glow discharge plasma at one atmosphere of pressure. Reference is made to FIG. 5d of the '854 patent to Roth wherein it is indicated that electrodes are embedded in an insulating coating to create plasma above electric field lines. This arrangement does not create a "wind".

A reference entitled "Demonstration of Separation Delay With Glow-Discharge Plasma Actuators," Lennart S. Hultgren and David E. Ashpis, NASA-TM-2003-2122041, REV 1, (AIAA-2003-1025), Glenn Research Center, Cleveland, Ohio, December 2004, discloses an actuator which is fabricated from printed-circuit board technology using seven electrode pairs. Application of a time-varying voltage to the electrode pairs is illustrated. This reference does not address the solar panel application. It does describe sequential applied voltage pulsing. This reference does not disclose the use of one pair of electrodes to create two plasma filled regions.

The article entitled "Aerodynamic flow acceleration using paraelectric and peristaltic electrohydrodynamic effects of a One Atmosphere Uniform Glow Discharge Plasma" by R. Roth, Physics of Plasmas Vol. 10, No. 5, pp. 2117-2126 May 2003, describes arrays of electrodes and phased operation.

The paper "Modeling of interaction between weakly ionized near-surface plasmas and gas flow" by A. V. Likhanskii, M. N. Shneider, S. O. Macheret and R. B. Miles, AIAA paper 2006-1204 is a numerical simulation of the device studying its operation under two types of voltage input. The first is the sinusoidal AC input at RF (Radio Frequency). The second is ultrashort pulses of a few nanosecond pulse width at high repetition rate of hundreds of KHz in combination with a positive DC voltage bias.

Geometry of electrodes and other characteristics were studied in the paper entitled "Optimization of the Aerodynamic Plasma Actuator as an Electrohydrodynamic (EHD) Electrical Device" by J. R. Roth and X. Dai, AIAA paper 2006-1203, January 2006. Different geometries of electrodes were studied and their operation under AC voltage and frequencies in the RF range to characterize performance with different dielectric material and amount of power dissipated to heat to determine their efficiency.

Another reference entitled "Optimization of a Dielectric Barrier Discharge Actuator by Stationary and Non-stationary Measurements of the Induced Flow Velocity—Application to Airflow Control" by M. Forte, J. Jolibois, E. Moreau and G. Touchard, AIAA paper 2006-2863, 2006, describes characteristics of the devices.

Plasmas are conductive assemblies of charged particles, neutrals and fields that exhibit collective effects. Further, plasmas carry electrical currents and generate magnetic fields. Plasmas are the most common form of matter, comprising more than 99% of the visible universe, and permeate the solar system, interstellar and intergalactic environments. Sometimes plasmas are designated by scientists as the fourth state of matter with gas, solid, and liquids being the other states of matter.

The terms glow discharge plasma and dielectric barrier discharge are terms used by those skilled in the art. Nonetheless, those terms are sometimes used imprecisely.

Historically, glow discharge was associated with DC discharge in vacuum. Later on there was an interest in AC discharges and discharges at atmospheric pressures. A dielectric barrier was added to the electrodes. The advantage is that the dielectric barrier with AC operation serves as a self-limiter allowing maintenance of a low power stable discharge without undesirable arcing that generates heat and large current and is not low power. The self-limiting mechanism is attributed to surface charges that accumulate on the dielectric surface and oppose the electrical field and result in repetitive stop and start of the discharge as the AC voltage progresses, limiting the current and preventing transition to the arc regime. The correct term for the phenomena is dielectric barrier discharge (DBD), but sometimes the term glow discharge is used incorrectly. The term single dielectric barrier discharge (SDBD) is also sometimes used to indicate that there is one layer of dielectric.

Electric glow discharges are found in a variety of areas, including lighting (fluorescent lights), television (plasma-screen television), plasma physics, material processing and analytical chemistry. In science, glow discharges are most often operated in direct-current mode. The electrical potential, gas pressure, and electrical current are interrelated. Only two can be directly controlled at once, while the third must be allowed to vary. Typically, the pressure is held constant. The other constant parameter depends on the application.

Wikipedia provides the following description: "A nonthermal plasma is, in general, any plasma or weakly ionized gas which is not in thermodynamic equilibrium, either because the ion temperature is different from the electron temperature, or because the velocity distribution of one of the species does not follow a Maxwell-Boltzmann distribution . . . . The nomenclature for nonthermal plasma found in the scientific literature is varied. In some cases, the plasma is referred to by the specific technology and configuration used to generate it ("gliding arc", "plasma needle", "plasma jet", "resistive barrier discharge", dielectric barrier discharges etc.), while other names are more generally descriptive, based on the characteristics of the plasma generated ("one atmosphere uniform glow discharge plasma", "atmospheric plasma", "ambient pressure nonthermal discharges", "non-equilibrium atmospheric pressure plasmas", etc.)". See, http://en.wikipedia.org/wiki/Nonthermal_plasma.

Dielectric-barrier discharges (DBD's) comprise a specific class of high-voltage, AC, discharges. Their defining feature is the presence of charges on the dielectric layers that limit the current.

SUMMARY OF THE INVENTION

A solar panel comprising a plurality of photovoltaic cells is disclosed. The solar panel includes a device for removing dust from the solar panel. An alternating current voltage source is applied to a first and second electrode with a dielectric separating the electrodes. In this example the electrodes may be embedded in the dielectric. The first electrode being partially embedded in the top part of the dielectric and exposed to the atmospheric gas. The second electrode is buried in the dielectric.

The substrate of the solar array may be made of dielectric material. In this case the dielectric material of the substrate may be common with the dielectric separating the electrodes.

Alternatively, the dielectric separating the electrodes may be of different physical and electrical properties than the dielectric substrate.

Alternatively, the dielectric material separating the electrodes may be constructed of horizontal layers of dielectric materials of different electrical and physical properties for the purpose of achieving desired properties and performance.

Alternatively, the dielectric material separating the electrodes may be constructed of vertical layers (perpendicular to the surface) or arbitrarily shaped segments of different electrical and physical properties for the purpose of achieving desired properties and performance, mainly by affecting the electrical field.

Alternatively, the dielectric material separating the electrodes may be made of continuously spatially varying properties for the same purpose. A transparent electrode may be used in conjunction with a transparent dielectric.

Another example is the circumstance where a transparent dielectric resides above the surface of the solar panel. The electrodes which may be very thin are positioned above the dielectric and below the dielectric. In effect the lower electrode is sandwiched in between the solar panel and the transparent dielectric. If a transparent dielectric is used then it is likely that the electrodes will be transparent. Use of a transparent dielectric cover above the surface of a solar panel having solar cells arranged therein enables light to pass through the dielectric to reach the solar cells.

A voltage source is applied across the first and second electrodes and is preferably an alternating current voltage source. The lower electrode is typically wider than the top electrode which may be a wire. The photovoltaic cell may reside in the dielectric.

The time varying voltage source is selected from a group of wave forms that include sinusoidally-shaped wave, square-shaped wave, triangular-shaped wave, saw-tooth shaped wave, or other desired wave shape. The voltage source may repeat the selected wave form at a constant frequency, or pulse it at a selected duty-cycle, including ultra-short pulse width (nanosecond range) or modulate the wave form using amplitude modulation (AM), frequency modulation (FM), or pulse width modulation (PWM) or other types of modulation. The voltage source may add a positive or negative DC voltage bias to the time dependent voltage.

The voltage source applied across the electrodes is an alternating current source and not necessarily a sine-wave as stated above. There is no need for a clean voltage waveform to be applied across the electrodes as the action of the plasma and the plasma sheath which leads just ahead of the plasma depends mainly on risetime of the signal not signal quality.

Alternatively, the electrodes can be deposited on the dielectric or painted on using a metallized paint. The electrodes may be affixed to the dielectric by adhesive. Preferably the electrodes are thin metal strips which extend the length of one of the rows or columns of solar cells arranged in an array in a solar panel. However, the upper electrode may be a wire as previously indicated.

In general, a solar panel includes a plurality of solar cells and a plurality of first and second electrodes arranged in an array. The solar cells may be embedded in a substrate or otherwise affixed or attached thereto. The solar panel may include first and second electrodes arranged in a pattern having unequal spacing therebetween. A plurality of voltage sources may be applied to selected electrodes. The voltage in a desired form or forms may be selectively applied to pairs of the electrodes in the array. The voltage in a desired form or forms may be sequentially applied to select pairs of the electrodes.

A sinusoidal voltage source may be applied and may, for example, be a 280 V RMS source provided the pressure is sufficiently low (6 Torr, 6 mm Hg). At atmospheric pressure, for example, voltages in the range of 1-20 KV RMS may be used depending on pressure, actuator geometry, operational and physical parameters. Other higher voltage ranges may be used as well depending on the parameters of the system.

By way of example, the electrodes may alternatively be transparent. Alternatively, a transparent dielectric may be used over the solar panel with or without transparent electrodes.

The solar panel may comprise a plurality of photovoltaic cells arranged in an array. A plurality of first and second electrodes are arranged in an array and located intermediate the plurality of photovoltaic cells. If a transparent electrode is placed over the solar panel and if transparent electrodes are used then it is possible to locate the electrodes in pairs (one above the dielectric and one below the dielectric) where desired.

The voltage source applied across the first and second electrodes of the solar panel array may include at least one pair of electrodes which may create two plasma filled regions on the surface of the solar panel.

An optional vibrator which may be a piezoelectric vibrator mechanically shakes the solar panel to loosen dust on the solar panel or its cover. The vibrator is controlled by the controller applying power to the vibrator when desired. The vibrator is an aid to the operation of the device and facilitates the removal of collected dust from the solar panel.

A process for removing dust from a solar panel comprising a plurality of photovoltaic cells, a voltage source, a dielectric, a first electrode, a second electrode, with the first and second electrodes separated from each other by the dielectric is disclosed and claimed.

A process for removing dust from a solar panel which includes a plurality of photovoltaic cells arranged in an array and having a plurality of first and second electrodes arranged in an array, comprises the steps of: applying a time-varying voltage source to each of the plurality of the first and second electrodes; sequencing the application of the time-varying voltage source to each of the plurality of the first and second electrodes; creating plasma filled regions on the surface of the solar panel or on a transparent cover residing above the solar panel; and, removing dust from the photovoltaic cells or a transparent cover. Alternatively, the process for removing dust from a solar panel may include a time-varying voltage source selected from the group of pulsed-wave, square-wave, triangularly-shaped wave and sinusoidally shaped wave or other time-varying signal shapes. The voltage source may be a frequency modulated (FM), amplitude modulated (AM), pulsed or other type of modulated signal.

Alternatively and/or additionally, the process may include the determination of the voltage level according to an algorithm dependent on solar cell performance. The controller, for instance, may measure the current generated by each solar cell or it may measure the current summed from a plurality of cells and use this information inferentially in determining to what extent the incident solar radiation has been occluded which in turn infers the amount of dust covering the panel. Then, in response to this information the controller may apply a different voltage level to the electrodes through, for example, a simple voltage divider circuit or the controller may change the sequencing, type of signal, or the pulse width of the signal. Additionally, a camera, optical sensor or other dust sensor (such as an opacity sensor) may be used to detect dust on the solar panel or on the transparent cover of the solar panel.

Alternatively and/or additionally, the process may include operation of the device periodically with a sufficiently high frequency so as to prohibit formation of dust on the solar panel or on the cover which resides over the solar panel. By sufficiently "high frequency" it is meant that the dust removal device is used anticipatorily whenever conditions dictate that dust might be formed. "High frequency" as used in this paragraph does not have anything to do with the signal applied to the electrodes. In this way dust is prevented from reaching the surface of a solar panel, a solar cell or a cover over the solar panel.

This invention includes, among other things, a dielectric barrier discharge (DBD) device. It is a device that is made of a pair of conducting electrodes separated by a dielectric material. When high voltage is applied to the electrodes, a plasma is generated on the surface near the exposed electrode. An electrohydrodynamic (EHD) effect creates a velocity or momentum in the ambient fluid near the surface which is a "jet" or "wind." The surrounding gas (fluid) is pumped toward the electrode and a jet is generated close to the surface in a general direction parallel to the surface. The EHD effect involves collisions between charged ions and neutral molecules that generate a body force in the surrounding gas. The plasma in the subject DBD is non thermal plasma.

There are different geometrical parameters and arrangements of the device, different choices of the dielectric material and the electrode conducting material and different options as to which time-dependent voltage wave form to apply to the electrodes.

Therefore, it is highly desirable to have a solar panel having electrodes positioned, dimensioned, arranged, powered and controlled so as to remove dust from the solar panel or a cover over the solar panel. Therefore, it is highly desirable to have a solar panel cleaned by a process for removing dust from a solar panel having a plurality of photovoltaic cells (solar cells) and a plurality of pairs of electrodes which create plasma filled regions for removing dust from the photovoltaic cells or a cover residing over the cells and the substrate which supports the cells.

Accordingly, it is an object of the present invention to provide a dielectric barrier discharge plasma which generates a flow of gas thus cleaning a surface of a solar panel or the cover over the solar panel. The plasma imparts a velocity to the surrounding gas and generates a flow of gas, sometimes referred to as a "wind". The ionized plasma does not flow and stays near the electrodes.

Accordingly, it is an object of the present invention to provide a dielectric barrier discharge plasma with two electrodes separated by a dielectric creating two ionized flow paths to clean the surface of a solar panel in two directions.

Accordingly, it is an object of the present invention to provide a solar panel cleaning device which includes a transparent dielectric overlay and pairs of electrodes mounted on opposite sides of the transparent dielectric.

Accordingly, it is an object of the present invention to provide transparent electrodes and a transparent dielectric for use in conjunction with a solar panel comprising solar cells embedded in, mounted on, or affixed to a substrate.

Accordingly, it is an object of the present invention to provide a controller for applying voltage waveforms to electrodes in a desired form and frequency to effect the creation of plasma for removing dust from solar panels and solar panel covers.

Accordingly, it is an object of the present invention to prevent the formation of dust on the solar panels and solar panel covers.

Accordingly, it is an object of the present invention to provide an array of photovoltaic cells and electrodes appropriately spaced for cleaning of the surface of the cells and the removal of dust therefrom.

Accordingly, it is an object of the present invention to provide an array of photovoltaic cells which may be operated at low voltages in low atmospheric pressure environments.

Accordingly, it is an object of the invention to operate a plurality of electrodes to clean a solar cell array at high efficiency and to minimize the power consumption of the dielectric barrier discharge plasma system.

Accordingly, it is an object of the invention to prohibit the formation of dust on the solar panel in the first instance by operating the electrode pairs to prevent dust from reaching the surface of the solar panel or a cover over the solar panel.

Accordingly, it is an object of the invention to produce a dielectric barrier discharge plasma using a dielectric having vertical and/or horizontal and/or segmented layers having different dielectric properties.

Accordingly, it is an object of the invention to provide an actuator having a continuously spatially varying dielectric properties.

Accordingly, it is an object of the invention to provide an dielectric barrier discharge actuator for use in cleaning a solar panel in combination with a piezoelectric vibrator.

These and other objects will be best understood when reference is made to the Description of the Invention and the Claims which follow hereinbelow.

BRIEF DESCRIPTION OF THE DRAWINGS

FIG. 2B is a schematic of another example of the invention wherein the substrate of the solar panel is a dielectric and wherein the upper electrode has the shape of a wire.

FIG. 2C is a schematic of another example of the invention wherein the upper and lower electrodes are transparent and are spaced on opposite sides of a transparent dielectric which resides in engagement with and above the solar panel.

FIG. 2E is a schematic of another example of the invention wherein the substrate is not conductive but is not necessarily a strong dielectric and an actuator dielectric resides on the surface of the substrate and electrodes reside on opposite sides of the actuator dielectric.

FIG. 2F is a schematic of another example of the invention wherein the substrate is not conductive but is necessarily a strong dielectric and an actuator dielectric resides in the substrate and electrodes reside on opposite sides of the actuator dielectric.

FIG. 2G is a schematic of another example of the invention wherein the substrate is a dielectric and the upper electrode is transparent and used over the solar cell which is embedded in the dielectric.

FIG. 2H is a schematic of another example of the invention wherein the substrate is a dielectric and the substrate is covered with transparent electrodes placed on opposite sides of a transparent dielectric layer directly above the substrate dielectric.

FIG. 2"O" is a schematic of another example of the invention wherein a segmented dielectric is used.

FIG. 4A is a cross-sectional view of the solar panel array taken along the lines 4A-4A in FIG. 4 illustrating the upper and lower electrodes.

FIG. 4B is an enlargement of the cross-sectional view of a portion of FIG. 4A.

FIG. 4D is a schematic side view of FIG. 4C and illustrates a transparent overlay (cover) adjacent to the solar panel.

FIG. 4E is a schematic side view similar to FIG. 4D and illustrates transparent electrodes arranged on opposite sides of a transparent overlay and which covers the photovoltaic cells.

FIG. 4F is a top plan view of another example wherein electrodes are arranged in a crossing pattern on opposite sides of a transparent overlay.

FIG. 4G is a cross-sectional view taken along the lines 4G-4G of FIG. 4F and illustrates the relationship of the electrodes arranged in a crossing pattern on opposite sides of a transparent overlay.

FIG. 4S is a schematic illustrating solar cells interconnected in series.

Figure 1:
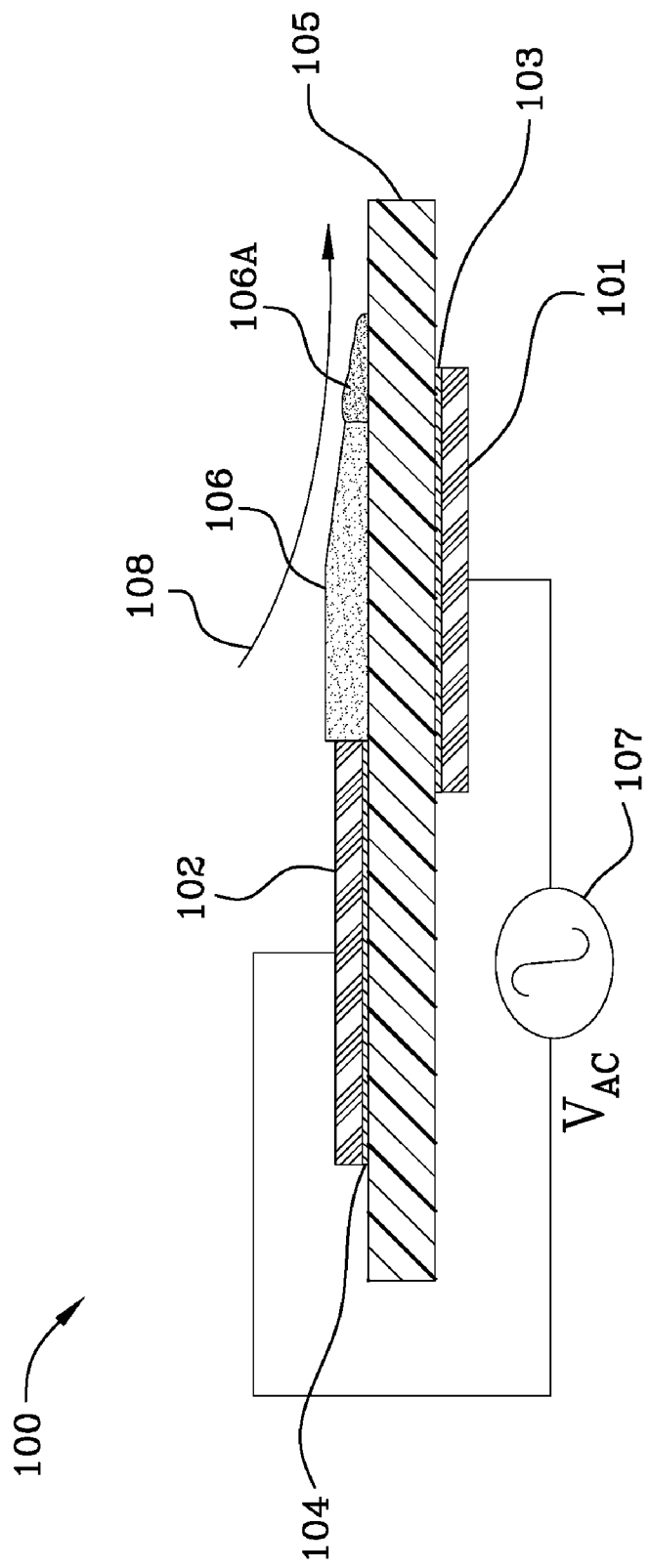
FIG. 1 is a schematic of an existing dielectric barrier discharge device used in aerodynamic applications for airfoil flow control.

The drawings will be best understood when the Description of the Invention and Claims are considered which follow herein below.

DESCRIPTION OF THE INVENTION

The dust is removed from the solar panel or a cover over the solar panel by blowing a stream of gas generated by an electronically operated device. The device is based on an actuator that imparts momentum or velocity to the surrounding atmospheric gas in a general direction parallel to the surface. The device is a dielectric barrier discharge (DBD) plasma actuator. It consists of two electrodes separated by a dielectric. The electrodes may be any suitable electrical conductor preferably aluminum or copper or an alloy thereof. The electrodes may be transparent to allow light to pass therethrough and the dielectric may be transparent. The electrodes may be deposited on the dielectric, adhesively affixed to the dielectric or painted on the dielectric.

The electrodes may be arranged in various configurations. The simplest configuration is two offset strips, but more complex configurations are possible. One example uses one exposed electrode on the surface and one electrode buried under the dielectric with a solar cell buried in the dielectric. Both electrodes can be buried in the dielectric.

Another example positions the electrodes on opposite sides of a transparent cover or overlay which sits atop a substrate which houses the solar cells. In this example the electrodes may be transparent and are, of course, conductive.

The transparent dielectric may be transparent insulating material, for example, Glass, Pyrex, Quartz, Sapphire, etc. Pyrex® is a registered trademark of CORNING INCORPORATED of New York. The transparent electrode may be deposited with a film deposition process like sputtering or chemical vapor deposition (CVD). The chemical composition of a common transparent conductor material is Indium-Tin Oxide (commonly acronym is ITO).

AC voltage, voltage pulses or other time varying voltages are applied to the electrodes. There are many possible forms for the voltage signal. For example, sinusoidal, saw-tooth, square wave, or other wave-form shapes may be applied. The applied wave form may be amplitude or frequency modulated or pulsed with various duty cycles. Ultra short pulses or phased electrode arrays also may be used.

The voltages may be applied to the electrodes in an anticipatory manner such that dust may not form on the solar panels in the first instance. In this example the electrodes are excited and create the "wind" of gas near the surface of the solar panel so as to prohibit or prevent the collection of the dust on the surface of the solar panel or on the cover over the surface of the solar panel.

The driving voltage is commonly an AC voltage and it is commonly in the RF (Radio frequency) voltage range. The range of frequencies used at Earth atmospheric condition is usually in the RF range between 2-20 kHz. The applied voltage creates dielectric barrier discharge plasma which is plasma that is localized on the surface near the surface of the electrode. The plasma creates a body force in the surrounding gas which creates a velocity in the gas. With the proper arrangement of electrodes, the velocity is roughly (approximately) tangential to the surface. When the driving voltage is a pure sinusoidal AC voltage the velocity will be steady and generates a steady wall jet. Pulsed or modulated voltage signals will generate unsteady velocities that vary in time.

Dielectric barrier discharge plasma actuators operated in Earth atmospheric pressure have been developed in recent years and are used in research of flow control of airfoil aerodynamics, ozone generation and disinfection of surgical tools.

FIG. 1, previously described, is a schematic of an existing dielectric barrier discharge device used in applications for airfoil flow control. FIG. 1 shows a typical arrangement of a dielectric barrier discharge plasma actuator. The particular arrangement moves the surrounding fluid and creates a thin wall jet on the surface.

Figure 2:
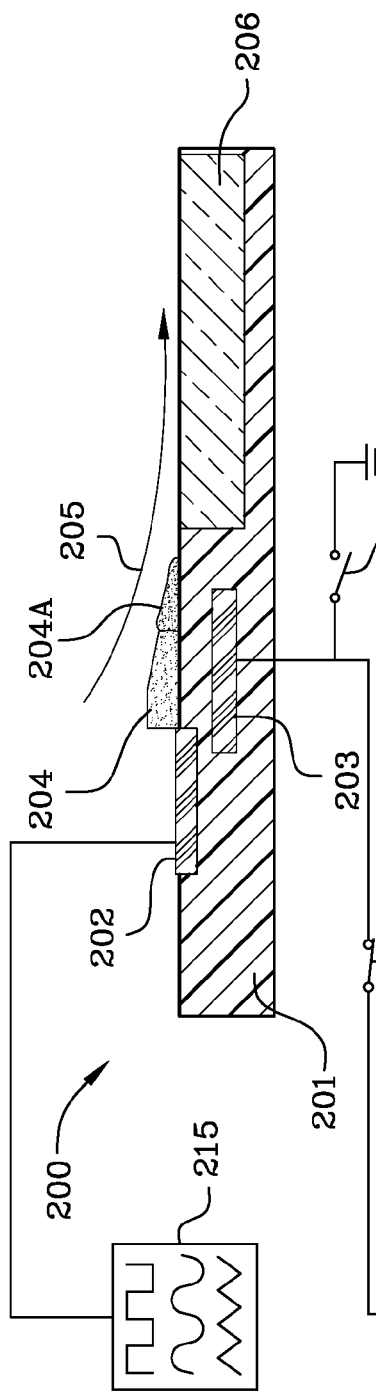
FIG. 2 is a schematic of an example of the invention wherein the substrate of the solar panel is a dielectric and wherein the dielectric barrier discharge device is illustrated in proximity to a solar cell for cleaning the surface thereof.

FIG. 2 is a schematic 200 of the invention illustrated in proximity to a solar cell 206. In particular, the solar cell (photovoltaic cell) 206 is embedded in dielectric substrate 201. The dielectric substrate 201 may be aluminum oxide, glass, sapphire, Kapton®, teflon, a typical printed circuit board, or other dielectric that may also be made of vertical or horizontal layers or made of material with spatially varying electrical properties. Kapton® is a trademark of E. I. Du Pont and de Nemours and Company.

Figure 2A:
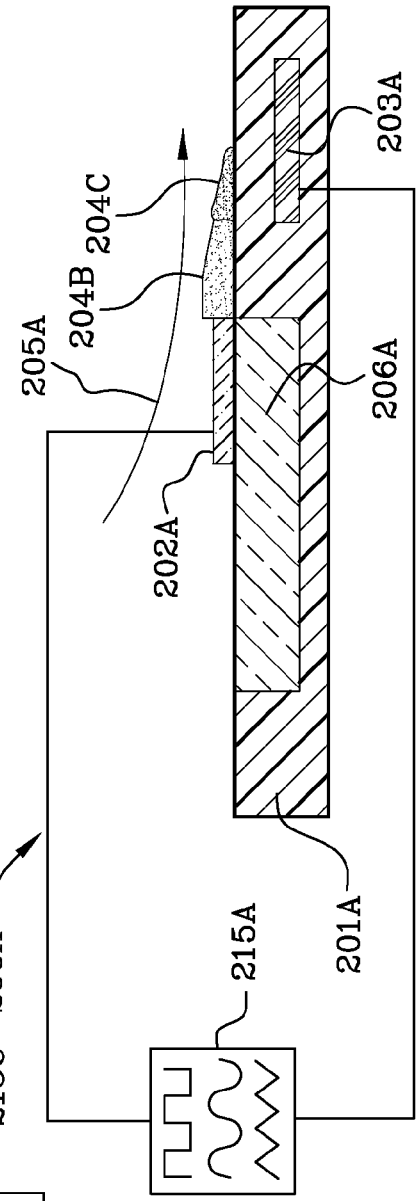
FIG. 2A is a schematic of another example of the invention wherein the substrate is a dielectric and one of the conductors is a transparent conductor positioned over a solar cell which allows solar light and radiation to pass therethrough.

Still referring to FIG. 2, the top electrode 202 may be embedded in the dielectric substrate 201 or it may slightly protrude from the substrate. Alternatively, the electrode may be on top of the substrate. As shown in FIG. 2, by way of example only, the upper electrode 202 overhangs or overlaps the lower electrode 203 which as shown is embedded in the dielectric 201. Alternatively, the lower electrode may be located on the lower surface of the dielectric 201. Still alternatively, the electrodes 202A, 203A may not overlap as illustrated in FIG. 2A.

When a sinusoidal, square wave, saw-tooth wave 215 or other time-varying voltage is applied to the electrodes, plasma 204 and ion sheath 204A are generated which in turn induce flow as indicated by the arrow and reference numeral 205. This flow or "wind" 205 propels dust from the surface of the photovoltaic cell 206 or if operated in an anticipatory way, prohibits or prevents dust from settling on the surface. The solar photovoltaic cell 206 is in electrical communication (not shown) with conductors or buses to transmit energy received from the sun.

Solar cell 206 may be used in parallel with other solar cells or it may be used in series with other solar cells as illustrated in FIG. 4S.

Additionally, the solar cell 206 may be in direct communication (not shown) with the electrodes 202, 203 which may serve a dual purpose as electrodes and as electrical interconnections for communicating the electrical energy from the solar cells to a storage device such as a lithium ion, nickel metal hydride, alkaline or other storage battery having appropriate gravimetric and volumetric capabilities. Switching (not shown) would be required if the electrodes serve the aforementioned dual purpose.

Still referring to FIG. 2, reference numeral 215C schematically illustrates application of a voltage 215C to the lower electrode 203 which is out of phase with respect to application of voltage 215 to the upper electrode 202. Switch 207 interconnects voltage waveform 215C to the lower electrode 203 when desired. Alternatively, voltage waveform 215 could be applied across electrodes 202, 203. Switch 208 connects electrode 203 to ground when desired and switch 207 is in the open position.

FIG. 2A is a schematic 200A of another example of the invention wherein one of the electrodes is a transparent electrode 202A which allows solar light and other electromagnetic radiation to pass therethrough. Still referring to FIG. 2A, the transparent electrodes 202A is the upper electrode and it is affixed directly above the solar cell 206A by adhesive or by some other mechanical affixation, by deposition techniques or by painting in areas between the solar cells. Lower electrode 203A is embedded in the dielectric substrate 201A. Induced flow as indicated by arrow 205A propels unwanted dust and debris from the solar cell 206A upon electrical excitation of the electrodes. Voltage 215A is applied across the electrodes 202A, 203A.

Figures 5, 5A:
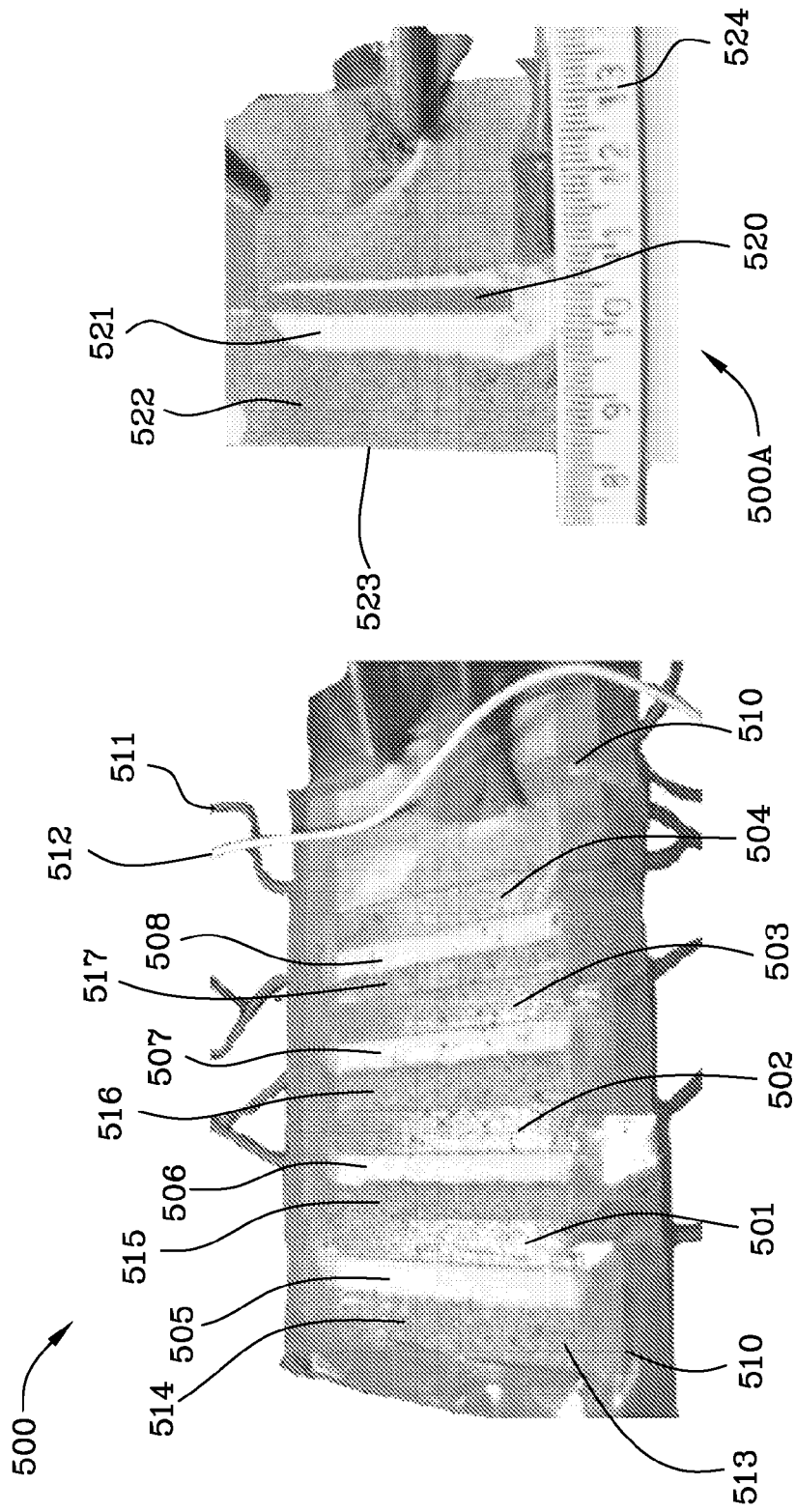
FIG. 5 is a photograph of a test article.
FIG. 5A is a photograph of another test article.

FIGS. 5 and 5A are photographs 500, 500A of actual experiments made by the inventor wherein very little dust resides on cleaned areas 505, 506, 507, 508, and 521. The experiment is disclosed below in detail.

FIG. 2B is a schematic 200B cross-section similar to FIG. 2 except that the upper electrode 202B is in the shape of a wire which extends across the entire width of the solar panel. Lower electrode 203B is plate shaped or flat as has been described elsewhere herein. The dielectric 201B is the same as previously described as is the solar cell 206B. Electrodes 202B and 203B are excited by a time varying voltage applied thereto creating plasma 204D, ion sheath 204E and "wind" 205B. Voltage 215B is applied across the electrodes 202B, 203B.

FIG. 2C is a schematic 200C of another example of the invention wherein the upper 260 and lower 261 electrodes are spaced on opposite sides of a transparent dielectric 262 which resides in engagement with and above the solar panel. In this arrangement the electrodes are preferred to be transparent electrodes and may, if desired, be positioned over the solar cell 206C which is embedded and secured to substrate 201C (which in this example is not conductive and is not necessarily a strong dielectric). The electrodes 260, 261 are excited by voltage waveform 215 creating plasma 263, ion sheath 263A, and "wind" 205C. Power from the cell is removed by means not shown. It should be noted that the use of transparent electrodes and a transparent dielectric facilitate efficient use of space on the solar panel. Use of transparent electrodes and/or a transparent overlay (cover) enables the individual solar cells to be arranged close together especially if the transparent electrodes are placed over the solar cells 206C.

Figure 2D:
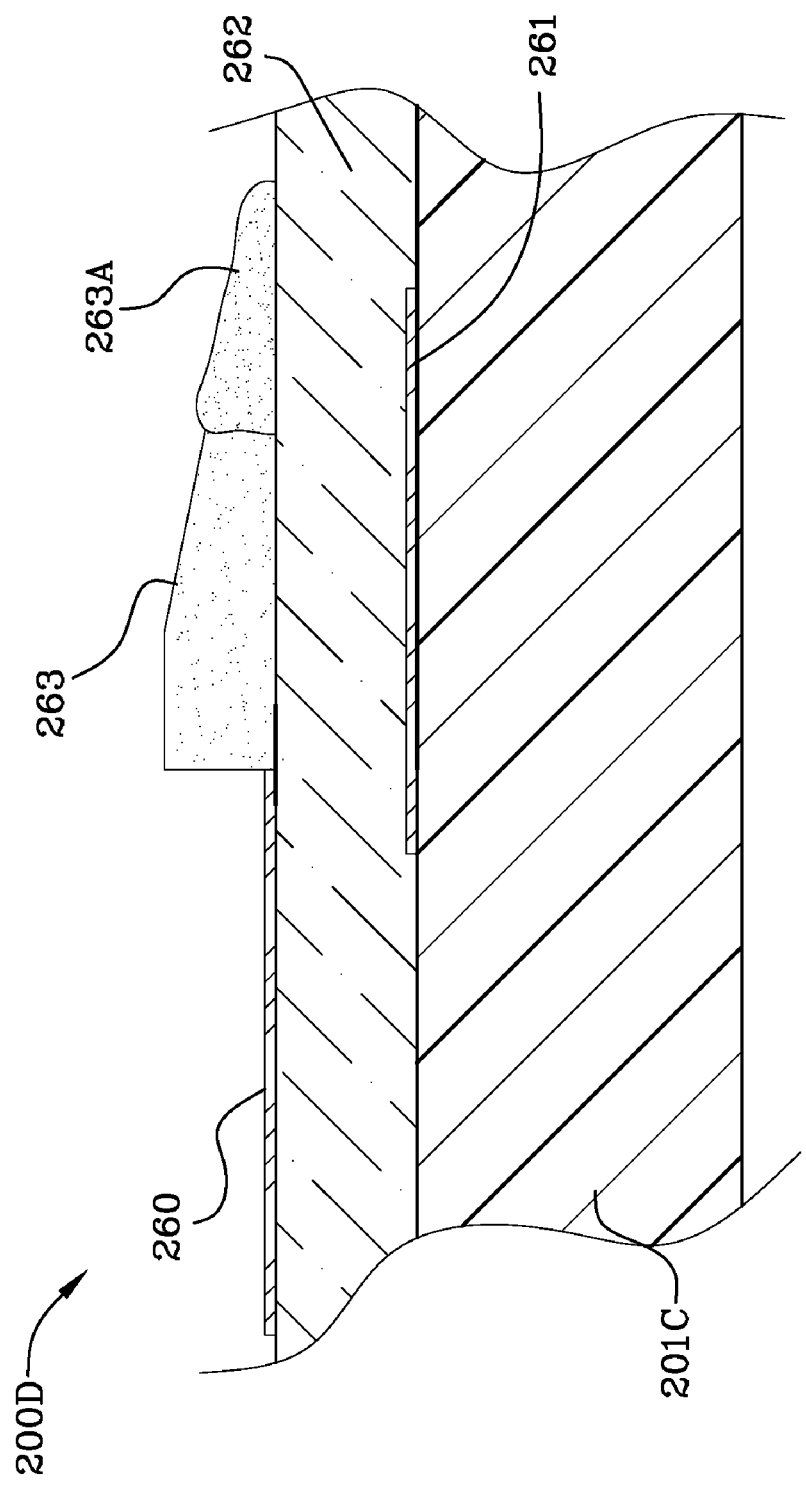
FIG. 2D is an enlargement of a portion of FIG. 2C better illustrating the thin upper and lower electrodes.

FIG. 2D is an enlarged portion 200D of FIG. 2C which better illustrates thin electrodes 260 and 261. Electrode 261 is essentially pushed into the transparent overlay 262 and may be embedded therein. Electrodes 260 and 261 may be transparent.

FIG. 2E is a schematic 200E of another example of the invention wherein the substrate 250 is not conductive but is not necessarily considered a strong dielectric and a dielectric 251 resides on the surface of the substrate 250 and electrodes 252, 253 reside on opposite sides of the dielectric. The substrate 250 is located beneath the dielectric 251. The substrate 250 may be a plastic or other material suitable for manufacture of a solar panel. The dielectric 251 may be any of those identified herein above. The solar cell 206E is embedded in the substrate 250. It is noted that the "wind" 254 is created by application of voltage wave form (not shown) to electrodes 252, 253 and the resulting plasma 255, and ion sheath 255A. The upper electrode 252, dielectric 251, and lower electrode 253 are located above the substrate 250 and to the left of the portion of the substrate which contains the solar cell 206E. The "wind" 254 travels across the top of the solar cell 206E from left to right and is approximately tangential to the top surface of the substrate 250.

FIG. 2F is a schematic 200F of another example of the invention wherein the substrate 270 is not conductive and but is not necessarily a strong dielectric and a dielectric 271 is embedded in the substrate 270 near the top of the substrate 270 and electrodes reside on opposite sides of the dielectric 271. The solar cell 206F is also embedded in the substrate 270. The upper electrode 272, plasma 275, and sheath 275A are located above the substrate 270 and to the left of the portion of the substrate which contains the solar cell 206F. Lower electrode 273 is embedded in the dielectric 271. The "wind" 274 travels across the top of the solar cell 206F from left to right approximately tangential to the surface thereof. The height of the upper electrode 272, plasma 275, and sheath 253 above the substrate is reduced from the height of the same elements in FIG. 2E.

Referring to FIGS. 2E-2P, time-varying voltages previously described herein are applied across the respective electrodes in ways previously disclosed herein.

FIG. 2G is a schematic 200G of another example of the invention wherein the substrate is a dielectric 280 and one of the electrodes (upper electrode) 282 is transparent and may be located directly over the solar cell 206G which is embedded in the dielectric substrate 280. The lower electrode 283 is located in the dielectric substrate 280. The plasma 285 is formed to the right of the upper electrode 282. The sheath 285A is located just ahead of the plasma 285 and is shown to the right of the plasma 285 in FIG. 2G. The "wind" 284 travels from the left to the right. Excitation of the electrodes to create the "wind" 284 is not shown but is as previously indicated in FIGS. 2-2C.

FIG. 2H is a schematic 200H of another example of the invention wherein the substrate 280A is not conductive and is not necessarily a strong dielectric and transparent electrodes (lower transparent electrode 292, upper transparent electrode 293) are located on opposite sides of a transparent dielectric layer 291 above substrate 280A. The solar cell 206H is located in the substrate 280A beneath the transparent electrodes 292, 293. "Wind" 294 is created by the plasma 295 and ion sheath 295A upon the excitation of the electrodes 293, 292, as previously indicated in FIGS. 2-2C.

Figure 2I:
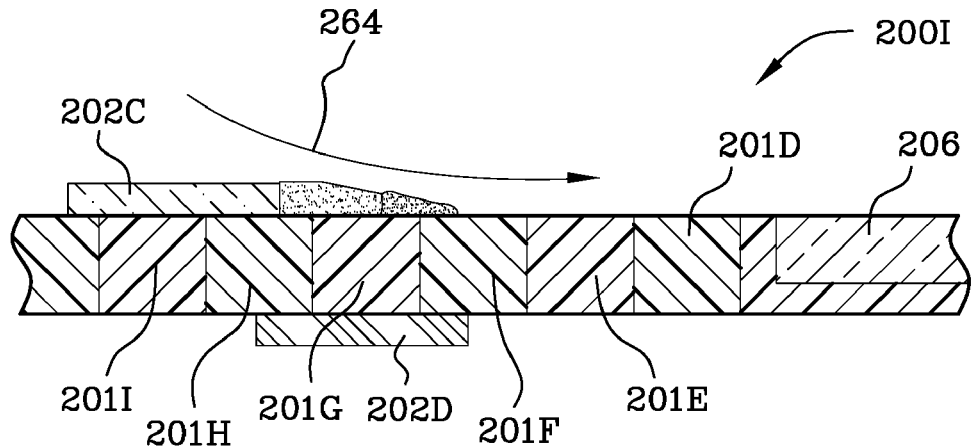
FIG. 2I is a schematic of another example of the invention wherein the substrate is a dielectric of vertical dielectric strips.

FIG. 2I is a schematic 200I of another example of the invention wherein the substrate is a dielectric of vertical dielectric strips 201D, 201E, 201F, 201G, 201H, and 201I. Electrodes 202C and 202D are positioned on either side of the vertical strips producing "wind" 264. Each of the dielectric strips has different dielectric (insulating) and physical properties. Selection of dielectric strips as desired will produce different electrical fields and will affect the "wind" generated. Sometimes dielectric materials will be picked based on physical properties like heat resistance. Electrode 202C may be metallic or optionally they may be transparent electrodes. If electrode 202C is a transparent electrode it may be positioned about (over) the solar cell 206.

Figure 2J:
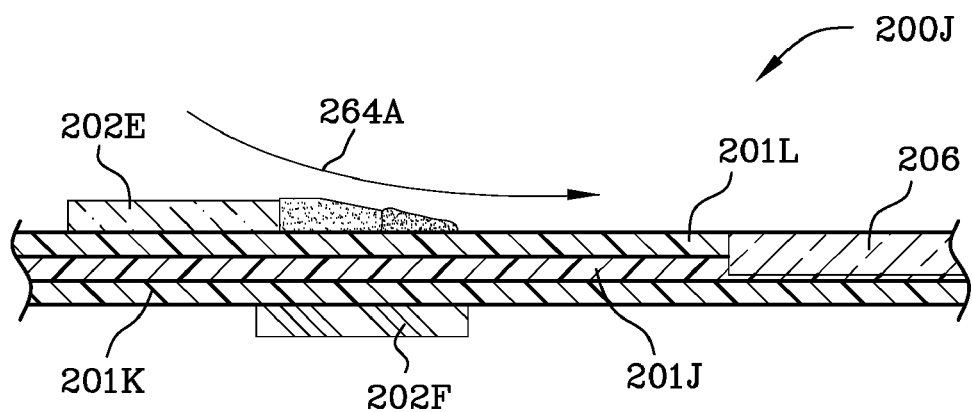
FIG. 2J is a schematic of another example of the invention wherein the substrate is a dielectric of horizontal dielectric strips.

FIG. 2J is a schematic 200J of another example of the invention wherein the substrate is a dielectric of horizontal strips 201J, K and L. Each of the dielectric strips has different dielectric or insulating properties. Selection of dielectric strips as desired will produce different electrical fields and will affect the "wind" generated. Electrodes 202E and 202F are positioned on each side of the compound substrate have horizontal layers which produce "wind" 264A. Electrodes 202E and 202F may be metallic and electrode 202E may be transparent. If transparent, electrode 202E may be positioned over the solar cell 206.

Figure 2K:
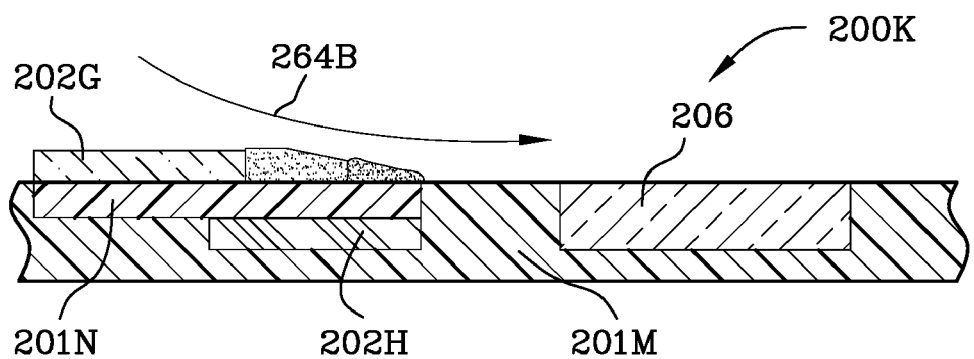
FIG. 2K is a schematic of another example of the invention wherein the dielectric of the actuator is not the same as the dielectric of the substrate.

FIG. 2K is a schematic 200K of another example of the invention wherein the dielectric 201N of the actuator is not the same as the dielectric 201M of the substrate. Electrodes 202G and 202H are positioned about the actuator dielectric 201N. "Wind" 264B is created. The dielectric 201N of the actuator may be embedded in the dielectric 201M of the substrate. Electrodes 202G and 202H may be metallic and electrode 202G may optionally be transparent. If transparent, electrode 202G may be positioned over the solar cell.

Figure 2L:
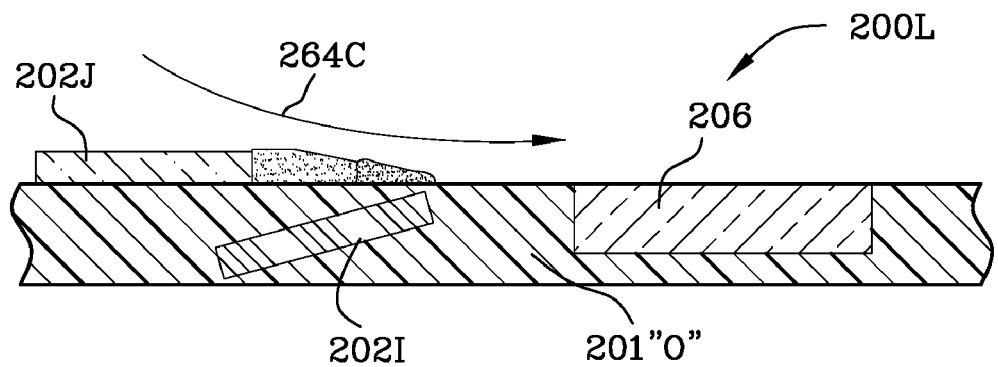
FIG. 2L is a schematic of another example of the invention wherein the lower electrode is oriented at an angle with respect to the upper electrode.

FIG. 2L is a schematic 200L of another example of the invention wherein the lower electrode 202I is oriented at an angle with respect to the upper electrode 202J. Dielectric 201"O" is used as the substrate. "Wind" 264C is generated.

Figure 2M:
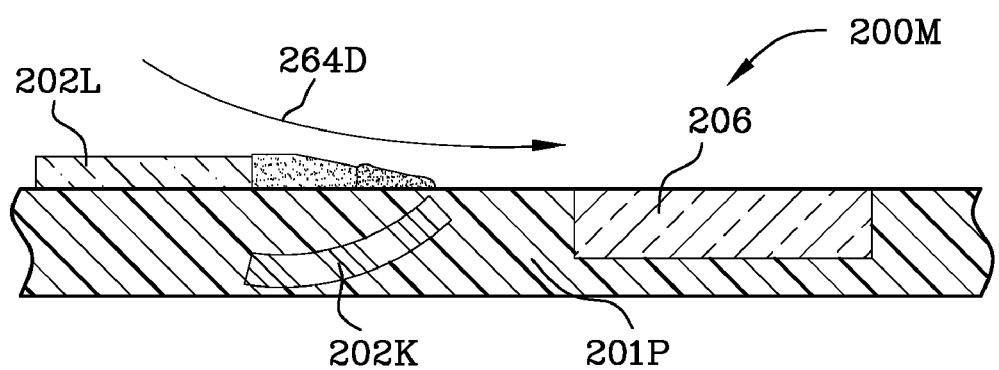
FIG. 2M is a schematic of another example of the invention wherein the lower electrode is curved with respect to the upper electrode such that the concave portion of the lower electrode faces the upper electrode.

FIG. 2M is a schematic 200M of another example of the invention wherein the lower electrode 202K is curved with respect to the upper electrode 202L such that the concave portion of the lower electrode faces the upper electrode. Dielectric 201P is used as the substrate. "Wind" 264D is produced.

Figure 2N:
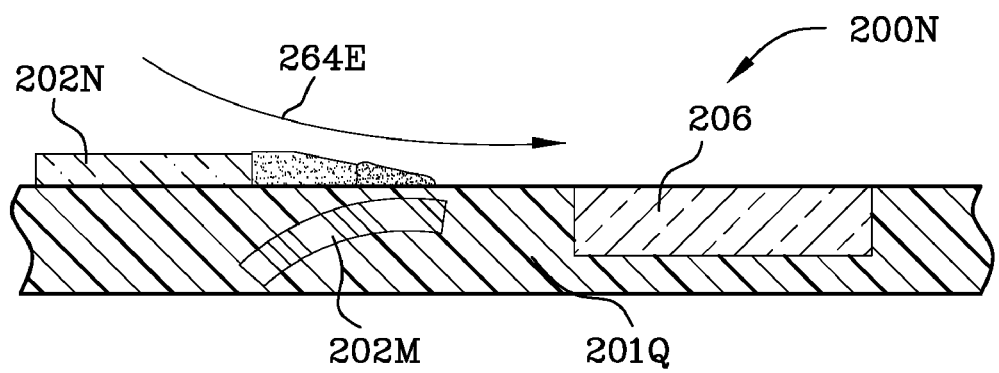
FIG. 2N is a schematic of another example of the invention wherein the lower electrode is curved with respect to the upper electrode such that the convex portion of the lower electrode faces the upper electrode.

FIG. 2N is a schematic 200N of another example of the invention wherein the lower electrode 202M is curved with respect to the upper electrode 202N such that the convex portion of the lower electrode faces the upper electrode. Dielectric 201Q is used as the substrate. "Wind" 264E is created.

FIG. 2"O" is a schematic 200"O" of another example of the invention wherein the substrate is made of a dielectric made of segments of dielectric materials, Each of the segments has different dielectric and physical properties. Selection of dielectric segments as desired will produce different electrical fields and will affect the "wind" generated. Reference numerals 201"R", 201"S", 201"T", 201"U", and 201V represent the dielectric segments. Electrodes 202 "O" and 202P are illustrated as is solar cell 206. "Wind" 264F is indicated as are respective plasma and sheath regions (unnumbered).

Figure 2P:
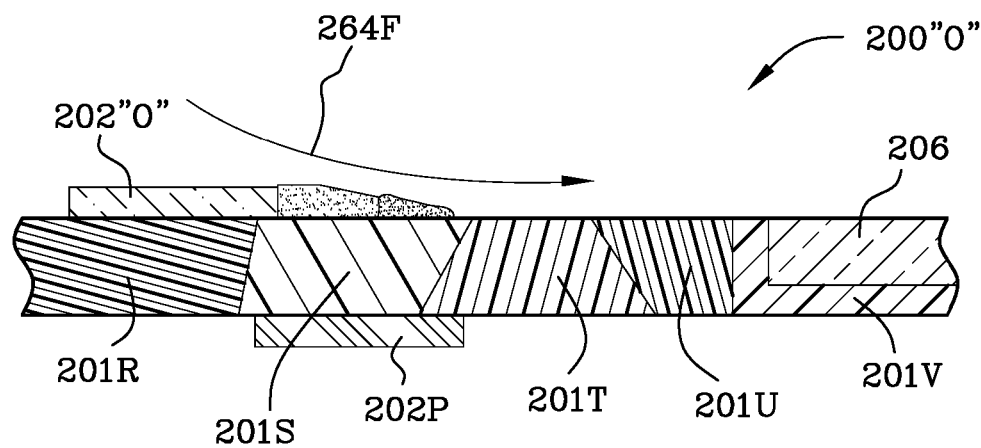
FIG. 2P is a schematic of another example of the invention wherein the properties of the dielectric vary continuously and spatially.
Figure 2P:
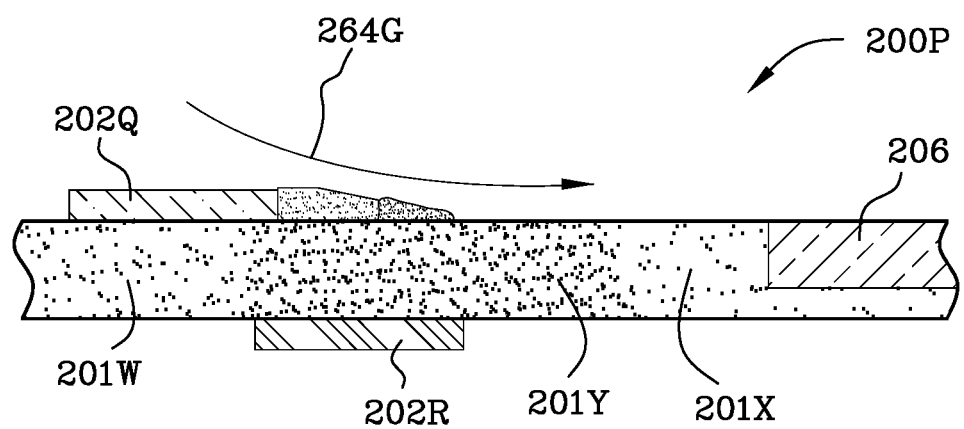

FIG. 2P is a schematic 200P of another example of the invention wherein the properties of the dielectric vary continuously and spatially. Reference numerals 201X, 201Y, and 201W indicate a dielectric that is variable in all portions thereof. Selection of the dielectric properties and the distribution thereof will produce desired electrical field variations and will affect the "wind" generated. Electrodes 202Q and 202R together with the dielectric form "wind" 264G.

Figure 3:
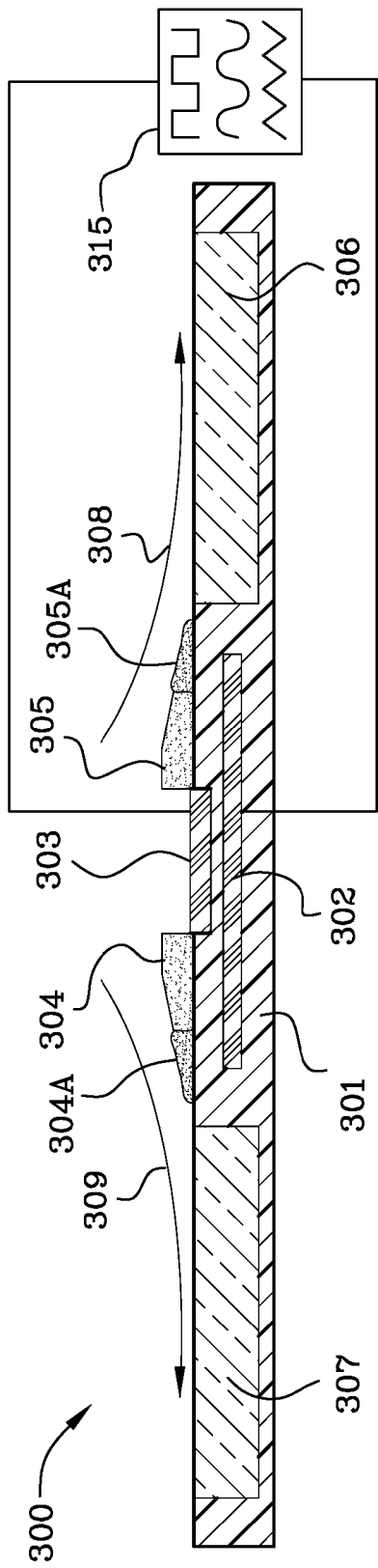
FIG. 3 is a schematic of another example of the invention wherein the substrate is a dielectric and two electrodes are employed creating two plasma regions which cause induced flow ("wind") in proximity to two solar cells embedded in the substrate.

FIG. 3 is a schematic 300 of another example of the invention employing two electrodes 302, 303 creating two plasma regions 304, 305 and two leading ion sheaths 304A, 305A, respectively, which cause fluid flow 308, 309 above and in proximity to two solar cells 306, 307 which remove dust and debris therefrom and clean them. As previously described above the example of FIG. 3 may be used anticipatorily to prevent the formation of dust on the solar panel (substrate and solar cells). Lower electrode 302 is indicated as embedded within dielectric 301 and upper electrode 303 is partially embedded in the dielectric as well while slightly protruding therefrom. As indicated above, when a sinusoidal, square wave, saw-tooth wave 315 or other time-varying voltage is applied to the electrodes, plasmas 304, 305 and ion sheaths 304A, 305A are generated which in turn induce flows as indicated by the arrows and reference numerals 308, 309.

Figure 3A:
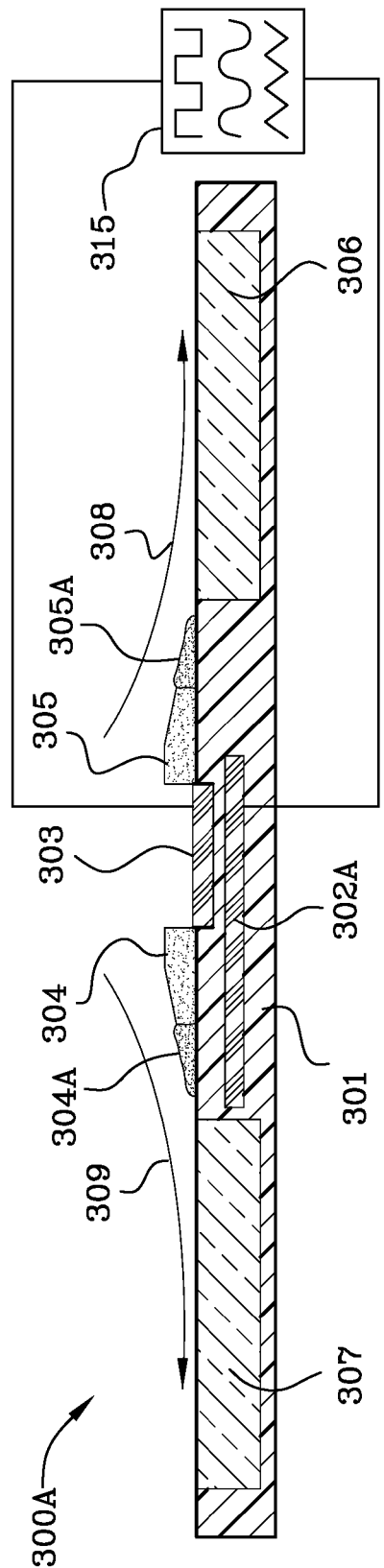
FIG. 3A is a schematic of another example of the invention wherein the substrate is a dielectric and employs two electrodes which are offset with respect to each other creating two plasma regions which cause induced flow ("wind") in proximity to two solar cells embedded in the substrate.

FIG. 3A is a schematic 300A of another example of the invention similar to FIG. 3 with the bottom electrode 302A offset with respect to the upper electrode 303. The examples of FIGS. 3 and 3A use fewer electrodes positioned between the solar cells. Also, the examples of FIGS. 3 and 3A insofar as electrode arrangement is concerned may be used in the other examples described herein. In the example of FIG. 3A, the "wind" indicated by reference numeral 309 will be stronger than the "wind" generated by reference numeral 308.

Figure 4:
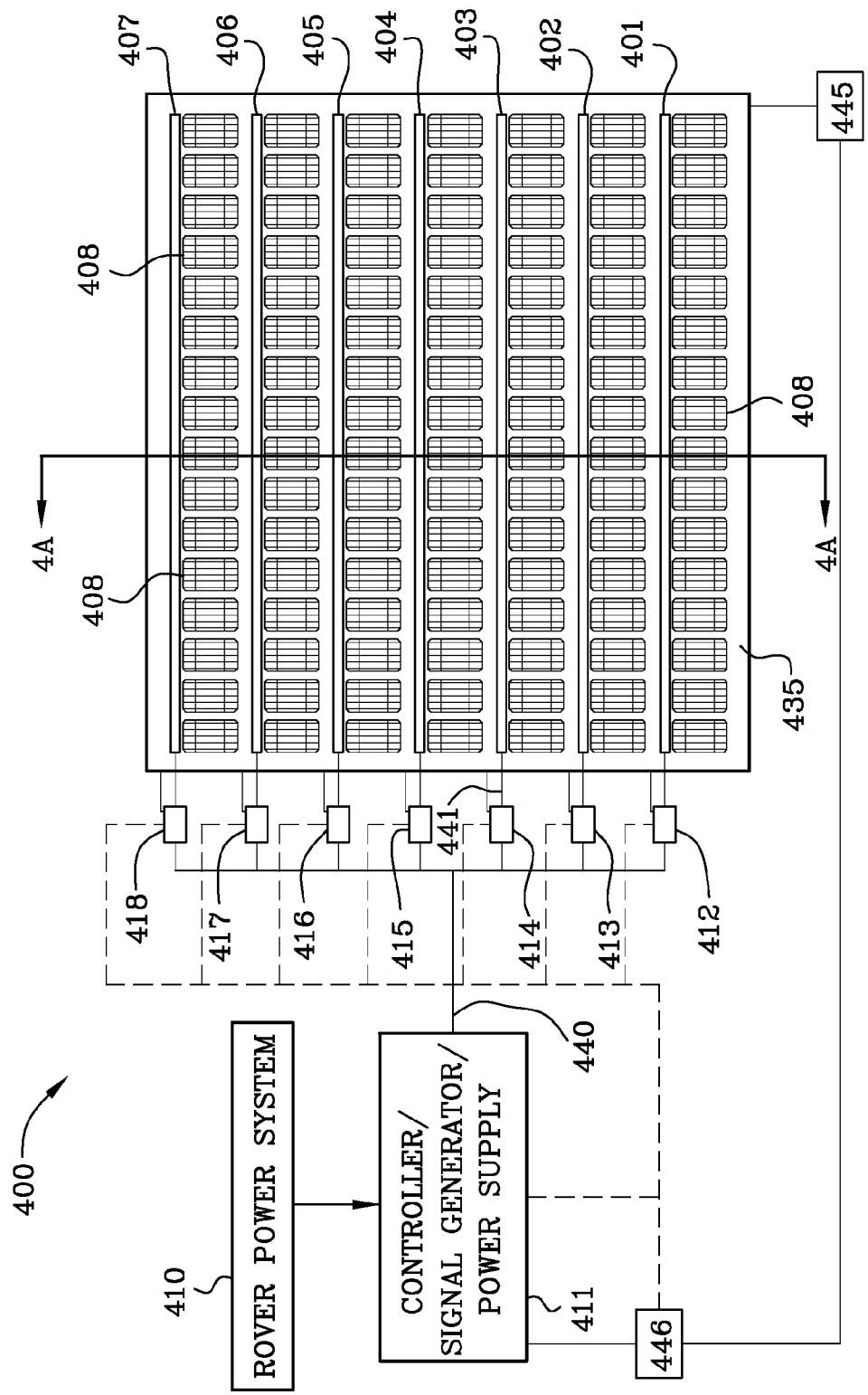
FIG. 4 is a schematic of a solar panel having an array of solar cells and electrodes between rows of the solar cells along with a controller for applying voltages for cleaning the solar cells.

FIG. 4 is a schematic 400 of a solar panel having an array of solar cells 408 and electrodes 401, 402, 403, 404, 405, 406, and 407 between rows of the solar cells 408 along with a controller 411 for applying voltages 215, 315 for cleaning the solar cells. The controller 411 applies voltages 215, 315 via line 440 to the electrode pairs through switches 412, 413, 414, 415, 416, 417 and 418.

FIG. 4 shows an arrangement of dielectric barrier discharge plasma actuator electrodes/strips and solar cells. The electrodes illustrated in FIG. 4 are the upper electrodes and may or may not be embedded in the dielectric 435. The dielectric barrier discharge plasma can be single-sided meaning that flow is established in one direction as illustrated in FIGS. 2 and 2A or it can be two-sided meaning that flow is established in two directions as illustrated in FIGS. 3 and 3A. The solar cells may be arranged in parallel as illustrated in FIGS. 4A and 4B or they may be electrically interconnected in series as illustrated in FIG. 4S or in any parallel or series combination desired. Preferably the solar cells are arranged in series as in FIG. 4S.

Figure 4C:
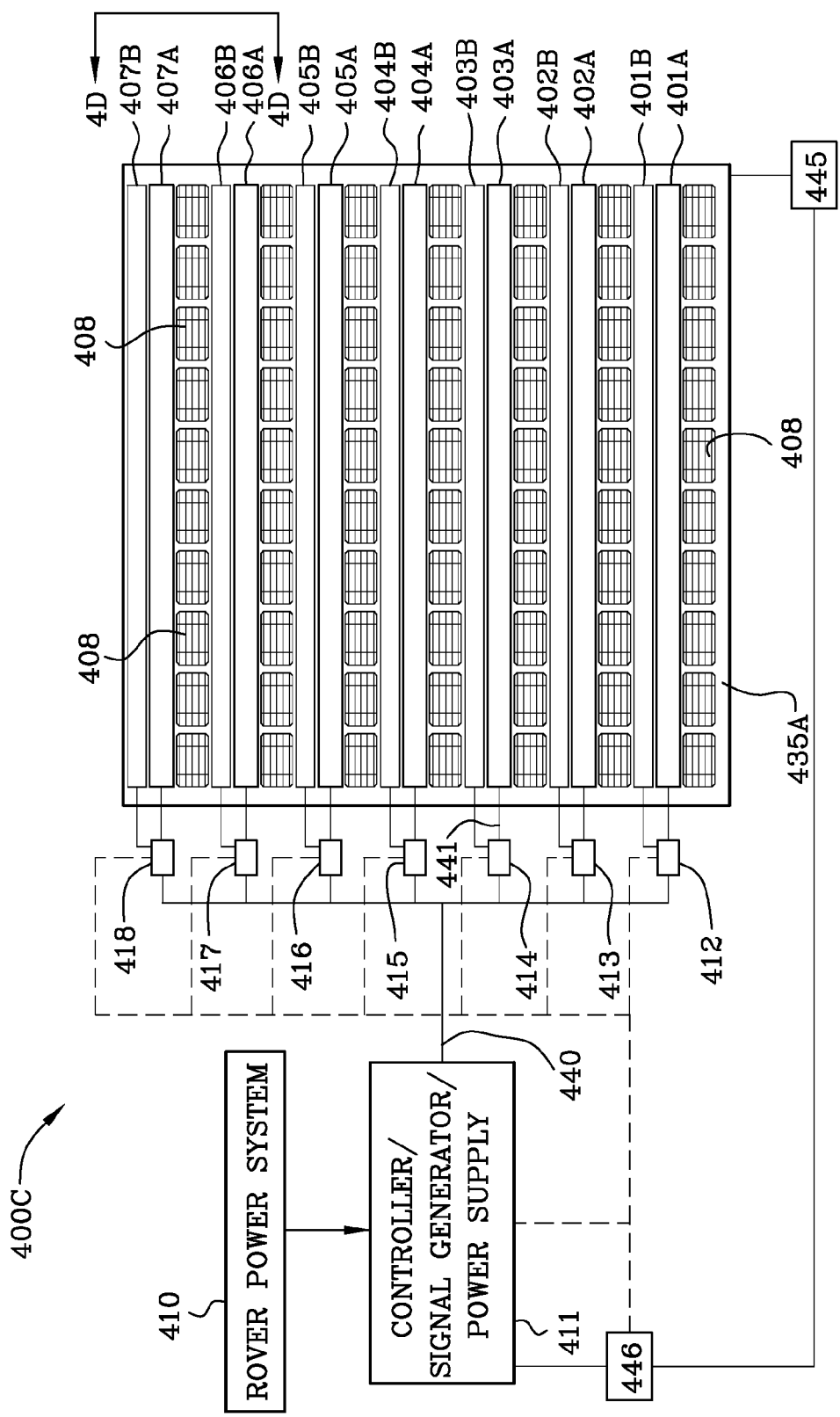
FIG. 4C is a schematic of a solar panel similar to FIG. 4 having an array of solar cells and electrodes between rows of the solar cells, along with a transparent cover thereover, and along with a controller for applying voltages across the electrodes for cleaning the solar cells.

The controller 411 includes the ability to selectively control certain electrodes through switching and hence application of the voltage waveforms 215, 315 to certain electrodes and thus control the cleaning of certain rows of solar cells and/or certain areas of the solar panel. The unnumbered dashed lines in FIGS. 4 and 4C are control lines for controlling the switches. Since rise time of the voltage difference between the upper and lower electrodes is an important concern insofar as effecting and inducing flow created by plasma as discussed in "Electrohydrodynamic Force and Acceleration in Surfaces Discharges," J. Boeuf, Y. Lagmich, T. Calligari, and L. Pitchford, CPAT, CNR, Université P. Sabatier, Toulouse, France, AIAA-2006-3574, 37th AIAA Plasmadynamics and Lasers Conference, San Francisco, Calif., Jun. 5-8, 2006, the controller 411 and switches 412, 413, 414, 415, 416, 417, and 418 apply pulsed, square waves, triangular (saw tooth) waves, and sinusoids 215, 315 or other wave forms to the electrode pairs in a controlled fashion. The signals applied to the upper and lower electrodes may also be frequency modulated or amplitude modulated signals or be some other type of modulation. The switches 412-418 control both electrodes and are capable along with the controller of applying signals to the electrodes which are out of phase or phase lagged with respect to each other such as those depicted with reference numerals 215, 215C in FIG. 2. The controller 411 is preferably a microprocessor. Alternatively, the application of the signals may be controlled using passive circuit elements such as resistors, inductors and capacitors to control the timing of the control signals.

The switches 412, 413, 414, 415, 416, 417 and 418 may be FETS or other electronic circuits all of which are controlled by the microcontroller 411 which may apply many different algorithms including phase changes from row to row or column to column to effect, for example, cleaning of a particular area of the solar panel (and have certain solar cells). Reference numeral 441 indicates an interconnection between the switches and the electrodes. Alternatively, the switches may be controlled with passive circuit elements. Further, depending on the deposition of the dust on the solar panel, certain areas of the solar panel may be cleaned and if the example of FIG. 3 is employed special cleaning to dislodge some unexpectedly heavy dust may be employed.

Additionally, time lags and sequencing of the control signals may be employed so as to time the movement of dust along the surface of the solar panel. Since the controller 411 is interconnected with the rover power supply 410 it is not dependent upon solar energy for cleaning the solar panel. In other words, the solar panel may be cleaned in an absence of light or in a shadow. Additionally, the invention may used with any power supply and not just a rover power supply. For instance, the invention may be used in terrestrial applications.

It will be noted that the system described herein for removal of dust (and the prevention of dust formation) on a solar array may be used in connection with other systems such as removing dust from the surface of a radiator. The invention may be used in many other applications wherein a different power system is used such as, for example, in connection with an electric utility application.

Additionally, the solar array may include spacing of the electrodes which is equidistant from electrode to electrode, not equidistant from electrode to electrode, or may include staggered parallel spacing. The spacing referred to may be with respect to the upper electrode, the lower electrode or a combination of the upper and lower electrodes. Also, the electrodes may undertake certain three dimensional geometries.

The array of electrodes employ the dielectric barrier discharge effect to create a "flow" or a "wind" as previously described to essentially blow dust from a solar panel. However, using the principles disclosed herein the array of electrodes may be periodically operated so as to prevent the formation of dust on the solar panel. Namely, the array when operated continuously prevents dust from reaching the surface of the solar panel or from reaching a cover placed over the surface of the solar panel. A camera or an opacity sensor may be used to sense the presence of dust in the atmosphere and as such be used in the control of the array.

Still referring to FIG. 4, the vibrator 445 may be a piezoelectric vibrator, which is optional, and mechanically shakes the solar panel to loosen dust on the solar panel or its cover. Vibrator 445 is controlled by the controller 411 applying power to the vibrator when desired via switch 446 controlled by the microprocessor. The vibrator is an aid to the operation of the device and facilitates the removal of collected dust from the solar panel.

FIG. 4A is a cross-sectional view 400A of the solar panel array set forth in FIG. 4 illustrating the upper 401, 402, 403, 404, 405, 406, and 407 electrodes and lower 421, 422, 423, 424, 425, 426 and 427 electrodes. Electrical busses 490, 491 are illustrated transmitting energy/electrical current from the solar cells. Solar cells 408 may be arranged preferably in series as in FIG. 4S.

FIG. 4S is a cross-sectional view 400S of a solar cell interconnected in series.

FIG. 4B is an enlargement 400B of the cross-sectional view of a portion of FIG. 4A.

FIG. 4C is a schematic 400C of a solar panel similar to FIG. 4 having an array of solar cells 408 and electrodes between rows of the solar cells along with a controller 411 for applying voltages 215, 315 across the electrodes for cleaning the solar cells 408. Reference numeral 435A depicts a transparent dielectric material which covers the solar panel. The broken lines represent microprocessor based control of switches 412-418. The switches shown in FIG. 4C are in fact dual switches for controlling each electrode of the respective pair of electrodes. The electrodes may be independently controlled for application of a time varying signal in the desired manner. The switches control lower electrodes 401A, 402A, 403A, 404A, 405A, 406A, 407A and upper electrodes 401B, 402B, 403B, 404B, 405B, 406B, 407B. The lower electrodes reside beneath the transparent dielectric overlay 435A and the upper electrodes reside above the transparent dielectric overlay 435A. The electrodes may, for example, be transparent electrodes and may reside directly over the rows or columns of the cells thus effectively utilizing the space available on the panel.

Referring to FIGS. 4C and 4D, the microprocessor 411 controls switch 446 which applies power to the vibrator 445. A vibrator 445, which may be a piezoelectric vibrator, is attached directly to the solar panel and substrate 471 and is used to shake dust loose from the transparent overlay 435A and prevents it from piling up which impedes the flow of the "wind" from the transparent overlay 435A. Loosening the dust on the transparent overly will make it easier to blow the dust off using the plasma devices. The vibrator is not a necessary and indispensable part of the invention. The device is effective without the vibrator. The vibrator is, in effect, an optional add-on to the invention.

FIG. 4D is a schematic 400D of a side view of a portion of the solar panel of FIG. 4C and illustrates a transparent dielectric overlay 435A adjacent and secured to the solar panel substrate 471 (not a conductor and not necessarily a strong dielectric). The transparent dielectric cover 435A is affixed to the substrate 471 of the solar panel with adhesive or other mechanical affixation. In the previous examples discussed above the transparent dielectric is affixed to the substrate with adhesive and/or other mechanical affixation. Upper electrodes 406B, 407B and lower electrodes 406A, 407A as illustrated in FIG. 4D. The electrodes are thin so as to not cause too much of a bump or hump in the dielectric overlay 435A when it is secured to the solar panel substrate 471. Alternatively, the electrodes may be embedded in the overlay so that it will be flush against the substrate. The electrodes may be affixed with adhesive, may be deposited, or may be painted. Induced flow is shown as "wind" arrows 406C and 407C which are illustrated by way of example and it is this "wind" that clears the dust from the solar panel.

FIG. 4E is a schematic 400E of a side view similar to FIG. 4D and illustrates transparent upper electrodes 406D, 407D and lower electrodes 406E, 407E arranged on opposite sides of a transparent overlay 435A. It will be noticed that the lower transparent electrodes 406E, 407E are placed over the photovoltaic cells 408. Induced flow is shown as "wind" arrows 406F, 407F which illustrate the sweeping motion of the induced flow or "wind" generated by the dielectric barrier discharges.

Referring to FIGS. 4D, 4E and 4F, voltage wave forms such as those indicated by reference numerals 215, 215A and 215C are applied to the electrodes to create the plasma and the "wind".

FIG. 4F is a top plan view 400F of another example wherein electrodes 481, 482 are arranged in a crossing pattern on opposite sides of a transparent dielectric overlay 435A. Electrodes which are not transparent may be used between the cells and may be affixed by adhesive, deposition, or painting. Alternatively, transparent electrodes may be used and are affixed to the overlay 435A by adhesive, deposition, or painting. If transparent electrodes are used they may be placed directly over the solar cells. The overlay is affixed to the substrate 471. FIG. 4G is a cross-sectional view 400G taken along the lines 4G-4G of FIG. 4F and illustrates the relationship of the electrodes 481, 482 arranged in a crossing pattern on opposite sides of the transparent overlay 435A.

FIG. 5A is a photograph 500A of a test article. Red Carbondale clay powder 522 was applied to the dielectric and copper electrode. An electrode made of copper tape 520 was applied to the aluminum oxide substrate 523 (i.e., a dielectric). Kapton covered the electrical leads for safety. Electrode 520 and ruler 524 are illustrated in FIG. 5A. Upon application of a sinusoidal voltage, the Red Carbondale clay was blown off to leave a clean surface strip 521 about 7 mm wide parallel to the actuator electrode. The dielectric barrier discharge plasma actuators have not yet been tested in Mars atmospheric conditions. The main difference is that Mars atmosphere is made of mostly carbon dioxide which may have different ionization properties than Earth's atmosphere. In addition, the atmospheric pressure on Mars is significantly lower than on Earth. The lower pressure is expected to significantly improve the performance of the device.

The AC voltage expected for the Mars environment is expected to be around 300 volts and, thus, can be controlled with solid state devices. The power supply that drives the actuator can then be made of purely electronic circuits for operation at low voltage levels. This is in sharp contrast with the present technology of dielectric barrier discharge plasma actuators used in aerodynamic applications in the Earth's atmosphere that require high voltages in the 5-15 KV range which are well above the capability of solid state devices and circuitry and usually requires transformers.

Therefore, the power supply that drives the dielectric barrier discharge plasma actuators can be very simple and light weight for the Mars rover application. Solid state operation and control of the solar panel enables flexibility as operation can take place in many different modes and at different power levels.

The solar panel cleaning apparatus will obtain its power from the Mars rover system and will be operated intermittently, so it will not consume a significant portion of the rover's available power. Phase lagging, time lagging, and time synchronization of the operation of the dielectric barrier discharge plasma strips/electrodes will cause dust to be removed from large areas of the solar panel.

FIG. 5 is another photograph 500 of a test article at atmospheric pressure. Reference numerals 511, 512 indicate two typical power leads for supplying power to the electrodes 501, 502, 503, and 504. Electrical insulation 510 is applied over the leads for safety. The substrate 513 is an aluminum oxide dielectric. Clean areas are signified by numerals 505, 506, 507, and 508. Dust, simulated to be Martian dust by using Carbondale Red Clay, is indicated by reference numerals 514, 515, 516, and 517. It will be noticed that in this experiment the simulated Martian dust was repositioned upon the application of voltage to the electrodes.

Different electrode arrangements and different control techniques may be applied to assure effective cleaning of the solar array. Since the force applied to clean using the dielectric barrier discharge plasma devices is a function of the applied voltage and signal wave form and frequency or time dependence function, different voltages and different rise times may be used along with sequencing, pulse width modulation, etc. to essentially sweep the dust from the solar panel where it exits the substrate or the cover thereof leaving behind a clean solar panel.

Figure 6:
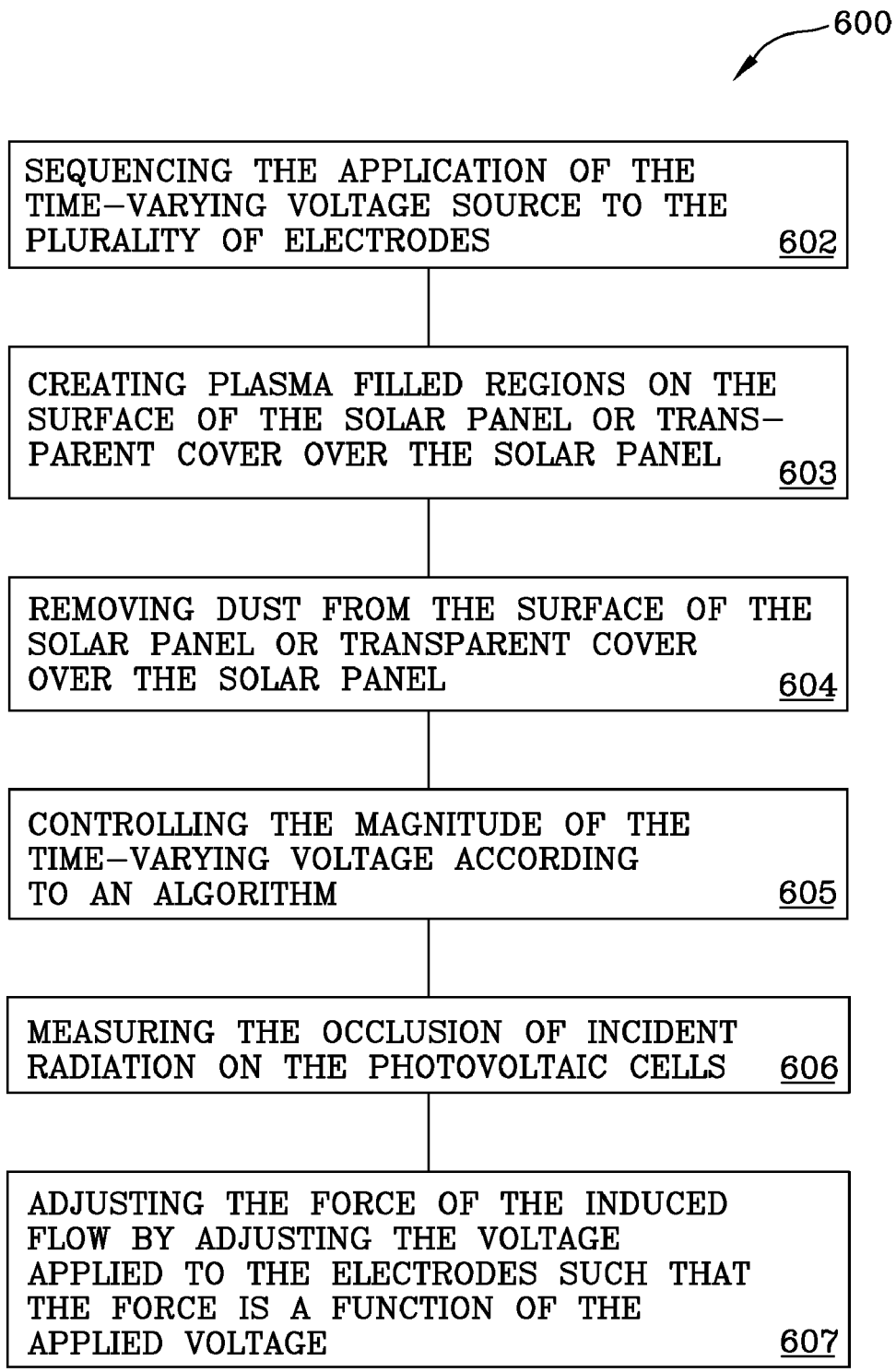
FIG. 6 is a schematic of one example of an algorithm for controlling the electrodes.

FIG. 6 is a schematic 600 of one example of an algorithm for controlling the electrodes. The voltage applied across the electrodes can be modulated as necessary by employing an algorithm previously described herein where the force created by the plasma which induces flow increases with the applied voltage. The controller 411 which is a microprocessor based controller enables the measurement of currents within the electrical grid of the solar panel by known analog current sensors which may be converted to digital signals using an analog to digital converter. The measured currents may then be compared to expected values of the incident radiation and then accordingly corrective action may be taken by adjusting the voltage. If the current output of the solar cells is below the expected value then the cleaning force applied to the surface of the solar panel must be increased. Alternatively, a camera or opacity sensor may be used to determine if dust resides on the solar panel or on a cover for the solar panel.

Therefore, the following process steps enable the control of the solar panel, namely, controlling, using a solid-state controller, application of a time-varying voltage source to a plurality of electrodes; sequencing the application of the time-varying voltage source to the plurality of electrodes 602; creating plasma filled regions on the surface of the solar panel 603 or on the surface of the transparent cover over the solar panel, removing dust from the photovoltaic cells 604 or the transparent cover over the cells; controlling the magnitude of the time-varying voltage according to an algorithm 605; measuring the occlusion of incident radiation on the photovoltaic cells or the cover thereover 606; and, adjusting the force of the induced flow by adjusting the voltage applied to the electrodes such that the force is a function of the applied voltage 607.

The steps illustrated in FIG. 6 may be performed in an order other than as indicated.

Alternatively, the process can be used to clean a transparent cover which is affixed to a solar panel by adhesive, mechanical affixation etc. Still alternatively, the process may be used periodically when dust is present in the atmosphere to prevent formation of dust on the solar panel or a transparent cover for the solar panel.

LIST OF REFERENCE NUMERALS

100—Dielectric Barrier Discharge Device
101—Bottom Electrode
102—Top Electrode
103—Adhesive
104—Adhesive
105—Dielectric Substrate
106—Plasma
106A—Ion Sheath
107—Alternating Current Voltage Source
108—Induced Flow
200—Schematic Arrangement of a Dielectric Barrier Discharge Device in Combination with a Solar Cell
200A—Schematic Arrangement of a Dielectric Barrier Discharge Device Utilizing Transparent Conductors in Combination with a Solar Cell
200B—Schematic Arrangement of a Dielectric Barrier Discharge Device Utilizing an Upper Electrode in the Shape of a Wire
200C—Schematic Arrangement of a Dielectric Barrier Discharge Device Utilizing a Transparent Dielectric Located above a Solar Panel
200D—Enlargement of a Portion of FIG. 2C
200E—Schematic Arrangement of Electrodes and Dielectric Above Substrate
200E—Schematic Arrangement of Electrodes and Dielectric Embedded in a Substrate 200G—Schematic Arrangement with Upper Transparent Electrode Covering the Cells and Lower Electrode Embedded in the Substrate
200H—Schematic Arrangement of Transparent Electrodes and Dielectric
200I—Schematic Arrangement of Dielectric With Vertical Strips
200J—Schematic Arrangement
200K—Schematic Arrangement of Actuator Dielectric Different From Substrate Dielectric
200L—Schematic of Electrodes At An Angle With Respect To The Other Electrode
200M—Schematic of Curved Electrode
200N—Schematic of Curved Electrode
200"O"—Schematic of variable dielectric
201, 201A, 201B, 201D-Q, 280, 301, 435—Dielectric Substrate
201C, 250, 270, 280A, 471—Substrate (Not Conductive, Not Necessarily A Strong Dielectric)
201E-I—Vertical Strips-Dielectric Substrate
201J-K—Horizontal Strips-Dielectric Substrates
201R, 201S, 201T, 201U, 201V—variable dielectric
201X, 201Y, 201W—continuously variable dielectric
202, 202B, 202C, 202E, 202G, 202J, 202L, 202N, 202P, 202"O", 202Q, 303—Top Electrode
202D, 202F, 202P, 202R—Lower Electrode
202A, 260, 261, 282, 292, 293, 406D, 406E, 407E, 407D, 407E, 481, 482—Transparent Conductor/Electrode
203, 202H, 202I, 202K, 202M, 273, 203A, 203B, 283, 302, 302A—Bottom Electrode Embedded in Substrate
204, 204B, 204D, 255, 263, 275, 285, 295, 304, 305—Plasma
204A, 204C, 204E, 255A, 263A, 275A, 285A, 295A, 304A, 305A—Ion Sheath
205, 205A, 205B, 205C, 254, 264, 264A-F, 264G, 274, 284, 294, 308, 309, 406E, 406F, 407C, 407F—Induced Flow
206, 206A, 206B, 206C, 206E, 206F, 206G, 206H, 306, 307, 408—Solar Cell
207, 208—Switches
262—Transparent Dielectric
215, 215A, 215B, 315—Voltage Source, Square wave, Sinusoidal Wave, and/or Saw-Tooth Wave
215C—Voltage Source, Square Wave, Sinusoidal Wave and/or Saw-Tooth Wave Out of Phase with Respect to the Voltage Source 215
251, 271—Dielectric
252, 272—Electrode
253, 273—Lower Electrode
262, 291—Transparent Dielectric
300—Schematic Arrangement of Another Dielectric Barrier Discharge Device in Combination With a Row of Solar Cells
300A—Schematic Illustration of Another Dielectric Barrier Discharge Device with Electrodes Offset With Respect to Each other;
400—Schematic of a Solar Cell Array and Controller Using the Dielectric Barrier Discharge Device
400A—Cross-Sectional Schematic View of FIG. 4
400B—Enlarged Cross-Sectional View of FIG. 4
400C—Schematic Arrangement Of a Solar Panel and Controller Using the Dielectric Barrier Discharge Device
400D—Side View of FIG. 4C
400E—Schematic Arrangement Of Transparent Electrodes Arranged on Opposite Sides of a Transparent Dielectric Overlay
400E—Top Plan View of Electrodes Arranged in a Crossing Pattern
400G—Cross-Sectional View of Electrodes Arranged in a Crossing Pattern
400S—Series Connection
401, 402, 403, 404, 405, 406, 407—Upper Electrodes
401A, 402A, 403A, 404A, 405A, 406A, 407A—Lower Electrodes
401B, 402B, 403B, 404B, 405B, 406B, 407B—Upper Electrodes
410—Rover Power System
411—Controller/Power Supply
412, 413, 414, 415, 416, 417, 418—Switches
421, 422, 423, 424, 425, 426, 427—Lower Electrodes
435—Dielectric Substrate
435A—Transparent Dielectric Overlay
440—Representative Interconnection between the Controller 411 and Switches 412, 413, 414, 415, 416, 417, 418
441—Representative Interconnection between Switch and Electrode
445—Piezoelectric Vibrator
446—Switch for Controlling Vibrator
490, 491—Bus
500, 500A—Photograph of a Test Article
501, 502, 503, 504, 520—Upper Electrodes
505, 506, 507, 508, 521—Cleaned Areas
510—Electrical Insulation Over Test Apparatus
511, 512—Wiring to/from the Electrodes
513—Substrate, Non-Conductive Dielectric (Aluminum Oxide)
514, 515, 516, 517—Dust Collection
522—Carbondale Red Clay Powder
523—Aluminum Oxide Substrate
524—Ruler
600—Block Diagram of Process Steps
602—Sequencing the Application of the Time Varying Voltage Source to the Plurality of Electrodes
603—Creating Plasma Filled Regions on the Surface of the Solar Panel
604—Removing Dust from the Photovoltaic Cells
605—Controlling the Magnitude of the Time-Varying Voltage according to an Algorithm
606—Measuring the Occlusion of Incident Radiation on the Photovoltaic Cells
607—Adjusting the Force of the Induced Flow by Adjusting the Voltage Applied to the Electrodes The invention has been described with particularity by way of examples herein. Those skilled in the art will readily recognize that changes may be to the invention without departing from the spirit and scope of the invention as set forth in the claims below.

The invention claimed is:

1. A solar panel, comprising:
a dielectric substrate having a top surface;
at least one photovoltaic cell having a top surface embedded in the dielectric substrate, wherein the top surface of the photovoltaic cell is at least partially exposed;
a first electrode;
a second electrode offset relative to the first electrode;
an alternating current voltage source electrically connecting the first and second electrodes and energizable to an on position;
plasma created along the top surface of the dielectric substrate when the first and the second electrodes are energized; and
an air flow induced by the plasma to mechanically propel dust away from the top surface of the photovoltaic cell.

2. A solar panel as recited in claim 1, wherein at least one electrode is in direct contact with the dielectric substrate.

3. A solar panel as recited in claim 2, wherein the first and second electrodes are separated by at least a portion of the dielectric substrate.

4. A solar panel as recited in claim 3, wherein at least one electrode is imbedded in the dielectric substrate.

5. A solar panel as recited in claim 1, wherein the plasma generated is dielectric harrier discharge (DBD) plasma.

6. A solar panel as recited in claim 5, wherein the dielectric substrate is selected from the group consisting of aluminum oxide, glass, sapphire, Kapton®, and Teflon or other suitable material.

7. A solar panel as recited in claim 6, wherein the first electrode, second electrode, and voltage source are electrically connected and energizable between an on and off position.

8. A solar panel as recited in claim 7, wherein the voltage source is selected from the group consisting of pulsed, modulated, square-wave, triangular, saw-toothed wave, and sinusoidal wave or other wave form.

9. A solar panel as recited in claim 1, wherein a plurality of photovoltaic cells are arranged to produce an array.

10. A solar panel as recited in claim 9, wherein a plurality of first and second electrodes are operable with the plurality of photovoltaic cells in the array.

11. A solar panel as recited in claim 10, wherein the alternating current voltage source is selectively applied to selected pairs of electrodes in the array.

12. A solar panel as recited in claim 1, wherein the top surface of the first electrode is substantially coplanar with the top surface of the photovoltaic cell.

13. A solar panel as recited in claim 12, wherein the electrodes are transparent.

14. A solar panel as recited in claim 13, wherein the dielectric substrate is transparent.

15. A solar panel as recited in claim 1, wherein the alternating current voltage source supplies alternating current waveforms to the first and second electrodes according to an algorithm.

* * * * *